(12) United States Patent
Van Schaijk et al.

(10) Patent No.: US 9,231,201 B2
(45) Date of Patent: Jan. 5, 2016

(54) ELECTRIC DEVICE WITH A LAYER OF CONDUCTIVE MATERIAL CONTACTED BY NANOWIRES

(75) Inventors: Robertus Theodorus Fransiscus Van Schaijk, Leuven (BE); Prabhat Agarwal, Leuven (BE); Erik Petrus Antonius Maria Bakkers, Eindhoven (NL); Martijn Henri Richard Lankhorst, Eindhoven (NL); Michiel Jos Van Duuren, Leuven (BE); Abraham Rudolf Balkenende, Eindhoven (NL); Louis Felix Feiner, Eindhoven (NL); Pierre Hermanus Woerlee, Eindhoven (NL)

(73) Assignee: NXP B.V., Eindhoven (NL)

( * ) Notice: Subject to any disclaimer, the term of this patent is extended or adjusted under 35 U.S.C. 154(b) by 1983 days.

(21) Appl. No.: 11/631,212

(22) PCT Filed: Jun. 28, 2005

(86) PCT No.: PCT/IB2005/052145
§ 371 (c)(1),
(2), (4) Date: Mar. 3, 2009

(87) PCT Pub. No.: WO2006/003620
PCT Pub. Date: Jan. 12, 2006

(65) Prior Publication Data
US 2009/0200536 A1    Aug. 13, 2009

(30) Foreign Application Priority Data

Jun. 30, 2004  (EP) .................................. 04103078
May 30, 2005  (EP) .................................. 05104625
Jun. 2, 2005   (EP) .................................. 05104806

(51) Int. Cl.
*H01L 47/00*   (2006.01)
*H01L 45/00*   (2006.01)
(Continued)

(52) U.S. Cl.
CPC ............. *H01L 45/1273* (2013.01); *B82Y 10/00* (2013.01); *G11C 13/025* (2013.01);
(Continued)

(58) Field of Classification Search
CPC ............ H01L 45/1233; H01L 27/2409; H01L 45/1273; H01L 27/2436; H01L 29/0673; H01L 29/0676; H01L 45/16; H01L 21/28525; H01L 45/06; H01L 27/2472; H01L 27/2481; H01L 21/76879; H01L 45/148; H01L 45/144; G11C 13/0004; G11C 2213/81; G11C 13/025; B82Y 10/00
USPC .................. 257/2–5, 773, E45.002, E21.508, 257/E21.171; 438/666, 576, 674, 675; 977/762, 891

See application file for complete search history.

(56) References Cited

U.S. PATENT DOCUMENTS 4,583,087 A * 4/1986 van de Venne .................. 345/84
6,084,796 A   7/2000 Kozicki et al.
(Continued)

FOREIGN PATENT DOCUMENTS

EP   1 473 767    11/2004
EP   1576676 B1   9/2005
(Continued)

OTHER PUBLICATIONS

W.D. Williams and N. Giordano, "Fabrication of 80 Å metal wires", Review of Scientific Instrumentation, vol. 55, p. 410, Mar. 1984.
(Continued)

*Primary Examiner* — Shouxiang Hu

(57) ABSTRACT

The electric device (100) according to the invention comprises a layer (107) of a memory material which has an electrical resistivity switchable between a first value and a second value. The memory material may be a phase change material. The electric device (100) further comprises a set of nanowires (NW) electrically connecting a first terminal (172) of the electric device and the layer (107) of memory material thereby enabling conduction of an electric current from the first terminal via the nanowires (NW) and the layer (107) of memory material to a second terminal (272) of the electric device. Each nanowire (NW) electrically contacts the layer (107) of memory material in a respective contact area. All contact areas are substantially identical. The method according to the invention is suited to manufacture the electric device (100) according to the invention.

3 Claims, 14 Drawing Sheets

(51) Int. Cl.
*B82Y 10/00* (2011.01)
*G11C 13/02* (2006.01)
*H01L 21/285* (2006.01)
*H01L 21/768* (2006.01)
*H01L 27/24* (2006.01)
*G11C 13/00* (2006.01)

(52) U.S. Cl.
CPC .... *H01L21/28525* (2013.01); *H01L 21/76879* (2013.01); *H01L 27/2409* (2013.01); *H01L 27/2436* (2013.01); *H01L 27/2472* (2013.01); *H01L 27/2481* (2013.01); *H01L 45/06* (2013.01); *H01L 45/1233* (2013.01); *H01L 45/144* (2013.01); *H01L 45/148* (2013.01); *H01L 45/16* (2013.01); *G11C 13/0004* (2013.01); *G11C 2213/81* (2013.01)

(56) References Cited

U.S. PATENT DOCUMENTS

| | | | |
|---|---|---|---|
| 6,605,535 | B1 | 8/2003 | Lee et al. |
| 6,882,051 | B2 * | 4/2005 | Majumdar et al. ............ 257/746 |
| 2003/0185047 | A1 * | 10/2003 | Khouri et al. ................. 365/163 |
| 2003/0209802 | A1 | 11/2003 | Awano |
| 2004/0037106 | A1 * | 2/2004 | Lu et al. ............................ 365/96 |
| 2004/0051161 | A1 | 3/2004 | Tanaka et al. |
| 2004/0109351 | A1 | 6/2004 | Morimoto et al. |
| 2004/0251551 | A1 | 12/2004 | Hideki |

FOREIGN PATENT DOCUMENTS

| | | |
|---|---|---|
| WO | 03024869 A1 | 3/2003 |
| WO | 03083949 A1 | 10/2003 |

OTHER PUBLICATIONS

K. Hiruma et al., "Growth and optical properties of nanometer-scale GaAs and InAs whiskers" Journal of Applied Physics, vol. 77, issue 2, p. 447-457, 1995.

C. R. Martin et al., "Membrane-based synthesis of nano-materials", Chem. Mater., vol. 8, pp. 1739-1746, 1996.

C. Schoenberger et al., "Template Synthesis of Nanowires in Porous Polycarbonate Membranes: Electrochemistry and Morphology" Journal of Physical Chemistry B, vol. 101, p. 5497, 1997.

A. Morales and C. Lieber et al., "A Laser Ablation Method for the Synthesis of Crystalline Semiconductor Nanowires", Science, vol. 279, p. 208-211, 1998.

C. P. Collier et al., "Electronically configurable molecular based logic gates" Science, vol. 285, pp. 391-394 (1999).

X. Duan and C.M. Lieber, "General synthesis of compound semiconductor nanowires" Advanced Materials, vol. 12, pp. 298-302, 2000.

Kok-Keong Lew, "Template-directed vapor—liquid—solid growth of silicon nanowires", Journal of Vacuum Science and Technology B, vol. 20, p. 389-392, Jan./Feb. 2002.

H. Tanaka et al., "Electrical switching phenomena in a phase change material in contact with metallic nanowires", Japanese Journal of Applied Physics, vol. 41, pp. L1443-L1445, 2002.

W. Zhuang et al., "Novell Colossal Magnetoresistive Thin Film Nonvolatile Resistance Random Access Memory (RRAM)", Tech. Digest IEDM, p. 193-196, 2002.

M.S. Gudiksen et al., "Growth of nanowire superstuctures for nanoscale photonics and electronics" Nature, vol. 415, p. 617-620, 2002.

M.T. Björk et al., "One-dimensional heterostructures in semiconductor nanowhiskers" Applied Physics Letters, vol. 80, p. 1058-1062, 2002.

S. De Franceschi et al., "Single-electron tunneling in InP nanowires" Applied Physics Letters, vol. 83, pp. 344-346, 2003.

* cited by examiner

ELECTRIC DEVICE WITH A LAYER OF CONDUCTIVE MATERIAL CONTACTED BY NANOWIRES

The invention relates to a method of manufacturing an electric device comprising a layer of an electrically conductive material, and a set of nanowires electrically connected to the layer of the electrically conductive material for conducting an electric current via the nanowires to the layer of the electrically conductive material.

The invention further relates to an electric device obtained by such a method.

The article "Electrical switching phenomena in a phase change material in contact with metallic nanowires", Japanese Journal of Applied Physics, volume 41, pages L1443-L1445, 2002 by H. Tanaka et al. discloses an electric device in which a phase change memory layer of $Ge_2Sb_2Te_5$, which is an electrically conductive material having an electrical resistivity switchable between a first value and a second value, is electrically contacted by metallic nanowires of Rh. The nanowires are embedded in a mesoporous polycarbonate membrane which has a 6 µm thick disk shape of 25 mm diameter with pores of 100 µm in diameter and $3 \cdot 10^8/cm^2$ in density. The pores exhibit random distribution on the membrane surface. A line-shaped gold (Au) layer of 25 µm width and 25 mm length deposited on one side of the membrane serves as a cathode for electroplating thereby forming the metallic nanowires in the pores of the membrane. The electroplating was stopped when the metal filled the pores. The phase change material was sputter-deposited on the superior side of the membrane so that a deposited line formed a right angle to the line of Au on the subordinate side of the membrane. The length, width and thickness of the phase change material were 2.5 cm, 25 µm and 500 nm, respectively. The crystal structure of the phase change material after fabrication was amorphous. Au was sputter-deposited on the phase change material. The memory cell is the overlapping area of the two Au electrodes, $25 \times 25$ µm$^2$, where 2000 nanowires exist. The number of electrically available nanowires, however, is expected to be far less than 2000 in the resistor because some of the nanowires did not reach the phase change material whereas other formed mushroom-like structures as is shown in FIG. 1 of the cited article. The two Au electrodes were provided with an electric signal to establish the electric resistance between them. The resistance was changed from a relatively high value to a relatively low value by providing a relatively high current. This change of the resistance was reversed by providing once more a relatively high current. The change of the resistance was attributed to a phase transition in the phase change material. Because the current at which the phase change material was changed from amorphous to crystalline was relatively low, the article suggests that the current was converged onto one nanowire where the phase change material became first conductive.

It is a disadvantage of the known method of manufacturing the electric device that the surface area of the contact surface with which each nanowire electrically contacts the layer of the electrically conductive material is largely prone to process fluctuations, such as variations in the length of the nanowires and/or variations in their shape, in particular at their end portion. As a result the electric switching signal at which the resistance of the phase change material is changed, is relatively poorly defined which renders it relatively difficult to reliably switch the resistance of the phase change material. When a number of electric devices is manufactured, it may happen that. some of the electric devices switch whereas others do not switch when provided with the same electric switching signal. Alternatively, or in addition, it may happen that some of the electric devices switch to a particular resistance value whereas others switch to another resistance value when provided with the same electric switching signal.

It is an object of the invention to provide a method of manufacturing an electric device in which the surface area is less effected by process fluctuations.

The above object is accomplished by the method according to the present invention.

The method according to the invention comprises the steps of:

providing a body having a set of prefabricated nanowires, subjecting the set of prefabricated nanowires to a material removal treatment for obtaining the set of nanowires, each of which having their respective contact surface exposed, and providing the layer of the electrically conductive material to the nanowires thereby electrically contacting each nanowire and the layer of conductive material in the respective contact surface.

Due to the step of subjecting the set of prefabricated nanowires to a material removal treatment, each nanowire electrically contacts the layer of the electrically conductive material in a respective contact surface, all contact surfaces having substantially the same surface area. In this way variations due to process fluctuation, such as variations in the length and/or in the shape of the prefabricated nanowires, are reduced and-preferably eliminated.

The method according to the invention is not limited to electrically conductive materials which have an electrical resistivity switchable between a first value and a second value. It may be also applied to contact an electric layer of e.g. copper or an copper alloy, aluminum or an aluminum alloy, or any other electrically conductive material.

The term substantially the same surface area implies that the variations in the surface area are typically below 20%, preferably below 10%. Due to the material removal step the remaining variations in the surface area are typically due to variations in the wire diameter of the nanowires.

In an embodiment the set of prefabricated nanowires comprises nanowires having different lengths and the material removal treatment results in a set of nanowires all having substantially the same length. In this embodiment, during the material removal treatment the length of the nanowires is reduced.

In an embodiment the set of prefabricated nanowires is provided on a body which is provided with a layer of dielectric material covering the set of prefabricated nanowires prior to subjecting them to the material removal treatment. This is particularly useful when the nanowires are provided at least partly free standing, as shown e.g. in FIG. 3. By providing a dielectric material prior to the material removal treatment, the chance of breaking a nanowire during the removal treatment is reduced.

The material removal treatment may comprise polishing such as chemical mechanical polishing with or without abrasive particles.

The conductive material may have an electrical resistivity switchable between a first value and a second value. The method according to the invention is particularly advantageous in this case because the switching signal is better defined. In general, the required switching signal depends on the surface area of the contact surface between the memory material and the respective nanowire. In the known electric device the contact area is different for different nanowires: some nanowires do not contact the layer of memory material, some other nanowires contact the layer of memory material in a contact area which is identical to the cross section of the respective nanowire perpendicular to the longitudinal direction in which the nanowire extends, i.e. the nanowires have a pencil like shape, and yet some other nanowires have a mushroom like structure at their end with which mushroom like structure they contact the layer of memory material. The size of the mushroom like structure is not fixed but is different for different nanowires. In the known electric device the size and shape of the contact area is subject to stochastic fluctuations which are inherent to the method to grow the nanowires. As a result the switching signal, which depends on the contact area, is subject to stochastic fluctuations as well, resulting in the relatively poorly defined switching signal. It should be noted that the resistance difference is typically significantly larger than any fluctuations in the contact resistance at the interface between the nanowire and the layer of electrically conducting material.

In contrast to this, in the electric device according to the invention all contact areas of the nanowires have substantially identical size and shape. The nanowires do not have significant variations in size and shape. This implies in particular that the nanowires do not have different shapes unlike in the known electric device where some nanowires have a mushroom like shape and others have a pencil like shape. In this context the expression "significant variations in size and shape" refers to a variation in size and shape which result in a significant change of the switching signal. The requirement does not imply that the contact area must be absolutely identical such as comprising the same number of atoms.

The invention is not restricted to the memory material used in the known electric device. It may be used in a electric device comprising other phase change materials such as e.g. disclosed in the non-pre-published European Patent Application with application number 03100583.8, attorney's docket number PHNL030259. In such phase change memories (PCRAM) the programming is done by thermally induced phase change between amorphous and crystalline state in a thin film of so-called phase-change material. To switch to the high-resistive amorphous state, the RESET pulse increases the temperature above the melting point of the material. The SET pulse heats the material above the crystallization temperature, but below the melting temperature to obtain the low resistive crystalline state. It is important that after the RESET pulse the quenching time of the RESET pulse is shorter than the material-dependent crystallization time, since otherwise the molten state will re-crystallize during cooling. In phase-change memories the reset power is relatively large. To minimize this power the phase-change volume should be as small as possible. This can be obtained by making the contact area between the electrode and phase change material as small as possible by using a nanowire for contacting the layer of the phase change material.

Alternatively, other classes of memory materials may be used such as used in programmable metallization cell memory elements which use an electrochemical cell between electrodes with dissolvable nano-filaments. By applying a voltage of a first polarity a metal wire is formed between the electrodes, so that the cell assumes a low resistance state. By applying a voltage of opposite polarity the metal is oxidized, and the cell assumes a high resistance state as is described e.g. in U.S. Pat. No. 6,084,796. Another example of memory materials is used in so-called RRAM, as described in W. Zhuang et al., Tech. Digest IEDM, page 143 (2002). Again another kind of programmable resistive memory is based on molecular storage, an example of which is described in more detail in the article "Electronically configurable molecular based logic gates" by C. P. Collier et al. in Science, volume 285, pages 391-394 (1999).

The invention is not restricted to an electric device which is switchable between just two different values of the resistance. Instead, it covers also resistors which may be switched between more than two different resistance values.

The term "nanowire" refers to quasi one-dimensional conductors or semiconductors. They extend along a longitudinal axis and have a wire length along this longitudinal axis from hundred nanometers or below to several micrometers or even longer. Perpendicular to the longitudinal axis the nanowires have a wire diameter, which may lead to quantum confinement effects described below and which is smaller than typically a few hundred nanometers. The wire diameter may be below 100 nm and may range, e.g., between 2 and 20 or 50 nm. Due to the relatively small dimensions perpendicular to the longitudinal axis charge carriers such as electrons and holes may be confined perpendicular to the longitudinal axis, i.e. in a radial direction. As a consequence the charge carriers may have discrete quantum mechanical energy levels, which are determined by the wire diameter. In contrast to this, due to the relatively large dimension along the longitudinal axis, the charge carriers are not confined in discrete quantum mechanical energy levels as function of the wire length.

The diameter of the nanowire is preferably below 50 nm such as 30 nm or below, such as 25 μm, 20 nm, 15 nm or 10 nm, or below.

The nanowires may be of a homogeneous composition, i.e. they may have the same chemical composition as function of the wire diameter and the wire length. Alternatively, some or all nanowires may be of a heterogeneous composition, i.e. they may have a chemical composition which is a function of the wire diameter and/or the wire length. The chemical composition may be changed due to doping of the semiconducting nanowire, which depends on the wire diameter and/or the wire length.

The term "nanowire" may describe both nanowires with a solid core and nanowires with a hollow core. The latter are also referred to in the art as nanotubes. Also in the latter type of nanowires charge carriers such as electrons and holes are confined perpendicular to the longitudinal axis, i.e. in a radial direction, due to the relatively small dimensions perpendicular to the longitudinal axis. As a consequence the charge carriers have discrete quantum mechanical energy levels, which are determined mainly by the thickness of the core defining this type of nanowire. Due to the relatively large dimension along the longitudinal axis, the charge carriers are not confined in discrete quantum mechanical energy levels as function of the wire length, analogous to the nanowires having a solid core. When the nanowire has a hollow core, the wire diameter refers to the thickness of the core. The thickness of the core is the difference between the outer wire diameter and the inner wire diameter, i.e. the diameter of the hollow part. A nanowire may be composed of one or more parts having a solid core and one or more parts having a hollow core.

In an embodiment each nanowire extends in a longitudinal direction and has a cross section perpendicular to the longitudinal direction, each contact area being substantially identical to the cross section of the respective nanowire. Then the nanowires do substantially not extend into the layer of memory material, but contact it only with their respective outer ends. In this embodiment the contact area is particularly small which results in a relatively small switching energy. In the known electric device the switching signal and the contact area depend on the surface of the mushroom like structure extending towards the gold electrode. This parameter is prone to process fluctuations and differs from one nanowire to another. In contrast to this, in the electric device according to this aspect of the invention the nanowires do not have such a mushroom like structure but they have a substantially constant diameter in the part of the nanowire contacting the phase change material.

In an embodiment, the nanowires extend into the layer of memory material.

This has the advantage that the manufacture of the resistor is relatively reliable because contacting the layer of the memory material with the nanowires is relatively easy.

In an embodiment, the layer of memory material is provided with a contact electrode for electrically connecting the layer of memory material, all nanowires contacting the layer of memory material having approximately the same distance from their end point to the contact electrode. The electric switching signal depends on the distance between the end of the nanowire and the contact electrode. When this distance is different for different nanowires in the same resistor, the switching signal is relatively poorly defined. According to this aspect of the invention this source of fluctuations in the switching signal is eliminated.

The electric device may comprise at least two mutually insulated terminal regions, each of which is electrically connected to the layer of electrically conductive material exclusively by a single nanowire. When the electrically conductive material is switchable between at least two different electrical resistivities, at least two different resistance values may be measured. The resistance values are determined by the resistivity of the parts of the layer of memory material electrically contacted by the respective nanowire. This has the advantage that the path of the electric current from one of the at least two mutually insulated terminal regions through the corresponding nanowire and thus the corresponding resistance value is relatively well defined. In particular, it is prevented that, once the resistance of a part of the layer of electrically conductive material contacted by a nanowire is altered, the current flows through another nanowire electrically connected to the same region. When the electrically conductive material is a phase change material this allows for using crystalline, low resistance phase change material which is only in a small volume close to the only nanowire switched in the amorphous, high resistance state. The overall resistance in such an electric device is relatively low, which results in a relatively low power consumption.

The electric device comprising at least two mutually insulated terminal regions, each of which is electrically connected to the layer of electrically conductive material exclusively by a single nanowire, is also advantageous if the layer of electrically conductive material is not switchable between at least two different resistivities. For example, the nanowire may comprise a transistor such as a gate around transistor which allows altering the resistance of the nanowire. This has the advantage that the path of the electric current from one of the at least two mutually insulated terminal regions through the corresponding nanowire and thus the corresponding resistance value of the corresponding connection is relatively well defined. In particular, it is prevented that, once the resistance of a nanowire is altered, the current flows through another nanowire electrically connected to the same region.

Because the respective nanowires and the layer of memory material have the same contact area, the switching signals to be applied to switch the resistivity is substantially the same for all nanowires of the set. They may be substantially the same for each of the at least two mutually insulated terminal regions of the first terminal.

The term "mutually insulated" implies that the terminal regions are not in direct electric contact with each other, e.g. by being part of one and the same continuous conductive layer. It does not, however, exclude that the terminal regions are electrically connectable by means of a switchable electric device such as a diode or a transistor which is arranged between them.

The layer of memory material may be a continuous layer or alternatively it may comprise one or more separate layers which constitute it.

The set of nanowires may comprise a nanowire which is a metallic conductor. Alternatively, or in addition, the set of nanowires comprises a single crystalline nanowire.

Such nanowires have a particularly low resistance which yields a switchable resistor with a relatively small overall resistance. Furthermore, it allows for an effective conduction of the switching signal which is important in particular when switching the memory material requires a relatively high switching energy.

At least one of the nanowires and the layer of electrically conductive material may be electrically connected to a selection device. The selection device is particularly useful when the layer of electrically conductive material and the set of nanowires are parts of an integrated circuit. Often the nanowires and/or the layer of electrically conductive material are electrically connected to a conductor to which also other electric elements are connected. The selection device allows for blocking an electric signal provided to those other elements from the nanowires and/or the layer of electrically conductive material by applying or removing an appropriate electric signal. The selection device may be a three terminal device such as a transistor, more particular such as a MOSFET or a bipolar transistor. Alternatively, the selection device may be a two terminal device such as a diode, more particular such as a pn diode, a pin diode, a Schottky diode or a punch through diode. The two terminal device allows for a relatively compact memory cell which is advantageous when integrated several memory cells in a device. With a two terminal selection device such as a diode it becomes possible to process cross point arrays on top of each other thereby obtaining several layers of memory cells stacked on top of each other. This results in a very compact 3D memory.

The diode may be an integral part of a nanowire of the set. This allows for an even more compact memory cell. Diodes may be integrated in a nanowire by using the vapor liquid solid (VLS) growth method. In this method the atoms to form the nanowires are provided as a vapor which condensates in a metallic catalytic nanoparticle from which the nanowire growths. By changing the composition of the vapor during growth, e.g. first adding a p dopant to a semiconductor and then adding a n dopant to a semiconductor, the doping of the nanowire may be changed, resulting in a pn diode. Other types of diodes such as a pin diode or a punch through diode may be obtained as well.

The selection device may be provided with a gate dielectric and a gate. The gate may be used in vertical diodes to reduce leakage currents, or in vertical transistors as the gate of a FET.

Leakage can occur at the surface of a nanowire due to interface states. In case of a diode, by a resp. negative or positive voltage on the gate a depletion region is formed in the N-type part (negative voltage) or P type part (positive voltage) of the diode. In both cases the depletion induced by the gate blocks the leakage current caused by the interface states at the surface of the diode. Because the voltage is the same for all selection diodes, the gate only has to be connected outside the array and does not need extra contacts in the array. Therefore, by introducing the gate hardly any additional space is needed.

The selection device may be arranged between the first terminal and the second terminal or it may be arranged before the first terminal or after the second terminal.

When the electric device comprises at least two mutually insulated terminal regions, each of which being electrically connected to the layer of memory material exclusively by a single nanowire, each of the at least two mutually insulated terminal regions may be electrically connected to a respective selection device.

The electric device may comprise an array of mutually insulated terminal regions each of which is electrically connected to the layer of electrically conductive material by one or more respective nanowires and each of which is electrically connected to a respective selection device. The layer of electrically conductive material may have a resistivity which is switchable between at least a first value and a second value. Each of these terminal regions is individually accessible via respective selection lines of a grid of selection lines which allow for operating the selection device accordingly. Such an electric device may constitute a random access memory (RAM) in which data may be stored by means of the resistivity of the layer of memory material connected to the respective nanowires.

In an embodiment the selection device comprises a metal oxide semiconductor field effect transistor having a source region, a drain region and a gate region, and the grid of selection lines comprises N first selection lines, M second selection lines, and an output line, the mutually insulated terminal regions being selected from the source region and the drain region of the corresponding metal oxide semiconductor field effect transistor, a further region of the corresponding metal oxide semiconductor field effect transistor selected from the source region and the drain region and being free from the terminal region being electrically connected to one of the N first selection lines, the gate region being electrically connected to one of the M second selection lines. Such an electric device is a RAM which may be embedded in an electric device based on CMOS technology.

These and other aspects of the electric device according to the invention will be further elucidated and described with reference to the drawings, in which:

FIG. 1 is a top view of an embodiment of the electric device at a first stage of the manufacturing, FIG. 2 is a cross section of an embodiment of the pre-fabricated electric device of FIG. 1 along line II-II, FIG. 2A is a cross section of an alternative embodiment of the pre-fabricated electric device of FIG. 1 along line II-II, where only metal clusters remain in a contact hole, FIG. 2B is a cross section of another alternative embodiment of the pre-fabricated electric device of FIG. 1 along line II-II, where a nanowire is grown in a via, FIG. 3 is a cross section of the pre-fabricated electric device along line II-II of FIG. 1 at a second stage of the manufacturing, FIG. 4 is a cross section of the pre-fabricated electric device along line III-II of FIG. 1 at a third stage of the manufacturing, FIG. 5 is a cross section of the pre-fabricated electric device along line II-II of FIG. 1 at a fourth stage of the manufacturing, FIG. 6 is a cross section of another embodiment of the pre-fabricated electric device at the fourth stage of the manufacturing, FIG. 7 is a cross section of yet another embodiment of the pre-fabricated electric device at the fourth stage of the manufacturing, FIG. 8A is another advantageous compact design of the array in top view.

FIG. 8B shows the corresponding cross section of the memory cell.

FIG. 8 is a cross section of yet another embodiment of the pre-fabricated electric device at an intermediate stage of the manufacturing, FIG. 9 is a cross section of yet another embodiment of the pre-fabricated electric device at an intermediate stage of the manufacturing, and FIGS. 10-13 are cross sections of another embodiment of the pre-fabricated electric device at successive stages of the manufacturing.

Figure 1:
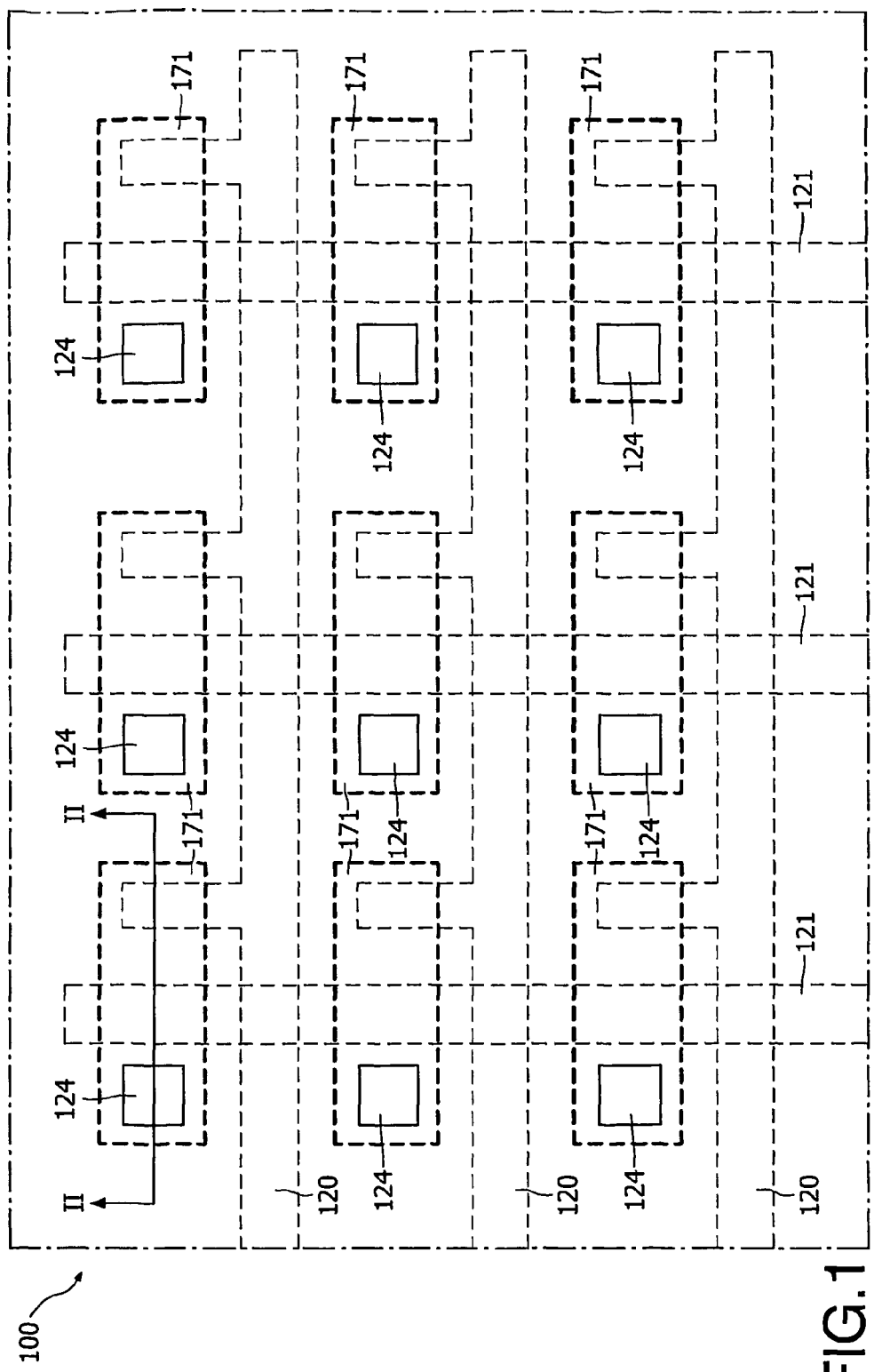

The Figures are not drawn to scale.

An embodiment of the electric device 100, shown in FIGS. 1-5 at various stages of the manufacturing, has a body 102, which comprises a substrate 101 which may comprise, e.g. a single crystal p-doped, silicon semiconductor wafer. The body further comprises an array of selection devices 171. In the embodiment shown in FIGS. 1-5 the electric device 100 has a 3×3 array but the invention is not limited to an array of this size nor to an array of this shape. The body 102 further comprises a grid of selection lines 120, 121 such that each memory cell is individually accessible via the respective selection lines 120, 121 connected to the respective selection device 171.

In the embodiment shown in FIGS. 1-5 the selection device 171 comprises a metal oxide semiconductor field effect transistor (MOSFET), and more specifically an NMOS transistor. The MOSFET has an n-doped source region 172, an n-doped drain region 173, and a gate region 174. The source region 172 and the drain region 173 may comprise more than one portion of n-doped material, such as a lightly doped n-portion and a more heavily doped n+ portion. The n-doped source region 172 and the drain region 173 are separated by a channel region. The gate region 174, formed above the channel region, controls the flow of current from the source region 172 to the drain region 173 through the channel region. The gate region 174 may comprise a layer of polycrystalline silicon. The gate region 174 is separated from the channel region by a gate dielectric layer.

The grid of selection lines 120, 121 comprises N=3 first selection lines 120 and M=3 second selection lines 121, and an output line. Mutually insulated terminal regions which are selected from the source region 172 and the drain region 173 of the corresponding metal oxide semiconductor field effect transistor will be provided later on in the process of manufacturing with nanowires. Further regions of the metal oxide semiconductor field effect transistors selected from the source region 172 and the drain region 173 and being free from the terminal regions are electrically connected to one of the N first selection lines 120. The gate region 174 is electrically connected to one of the M second selection lines 121. In the embodiment shown in FIGS. 1-5 the mutually insulated terminal regions are the source regions 172, and the further regions are the drain regions 173. In another embodiment, not shown, the mutually insulated terminal regions are the drain regions 173, and the further regions are the source regions 172.

In this embodiment the drain regions 173 are connected to the first interconnect layer, also referred to as metal 1, the gate regions 174 are connected to the second interconnect layer, also referred to as metal 2 and the contact hole for the nanowires is connected to the third interconnect layer, also referred to as metal 3, or to a higher interconnect layer. Because the select transistor 171 is a symmetric device, the nanowire can be grown either in the contact hole connecting the source region 172 or the drain region 173.

Such relatively deep contact holes in which the nanowires have to be grown may be avoided by connecting the nanowires to metal 1. The selection lines 120, 121 are connected to line selection devices and row selection devices, respectively, both of which are not shown.

The gate region 174 and the drain region 173 are provided with layers of tungsten silicide and tungsten plugs 122 for electrically connecting the gate region 174 and the drain region 173 to the selection lines 121 and 120, respectively. In this schematic drawing, metal 1 and the tungsten plug 122 connect the source region 172, whereas metal 2 and the tungsten plug 122 connect the gate region 174. In reality the source contact and gate contact lie not in the same plane as the drain contact (e.g. further backwards or forwards in the array), so that the source gate and drain contacts are usually not visible altogether in the cross section through II-II of FIG. 1. The selection lines 120 and 121 are formed from a conductive material such as, e.g., aluminum or copper. The array of selection devices 171 and the grid of selection lines 120, 121 are formed using standard IC technology.

Figure 2:
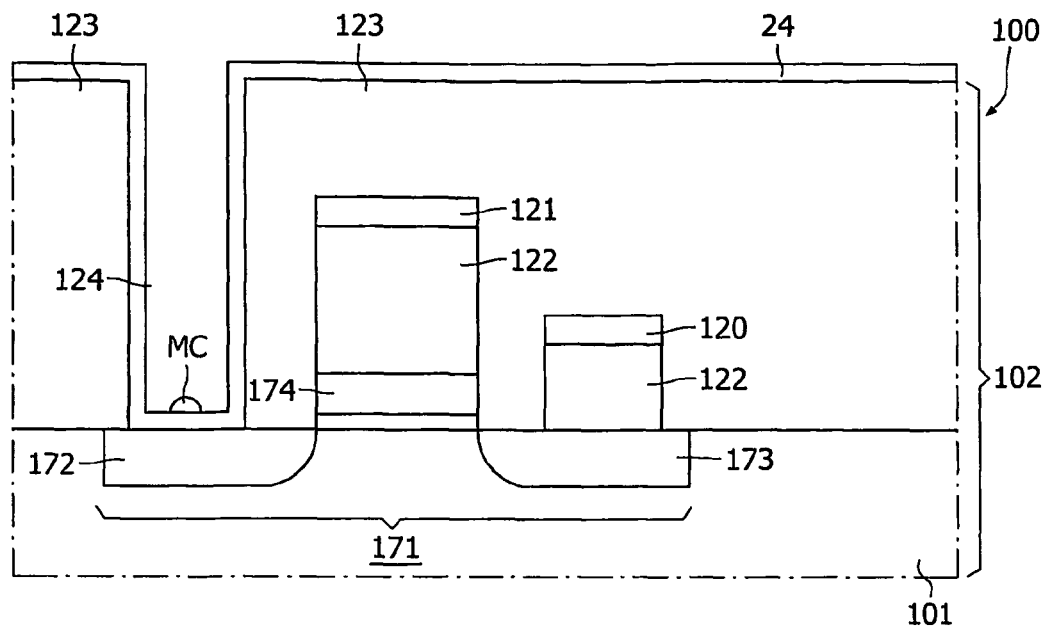
Figure 2A:
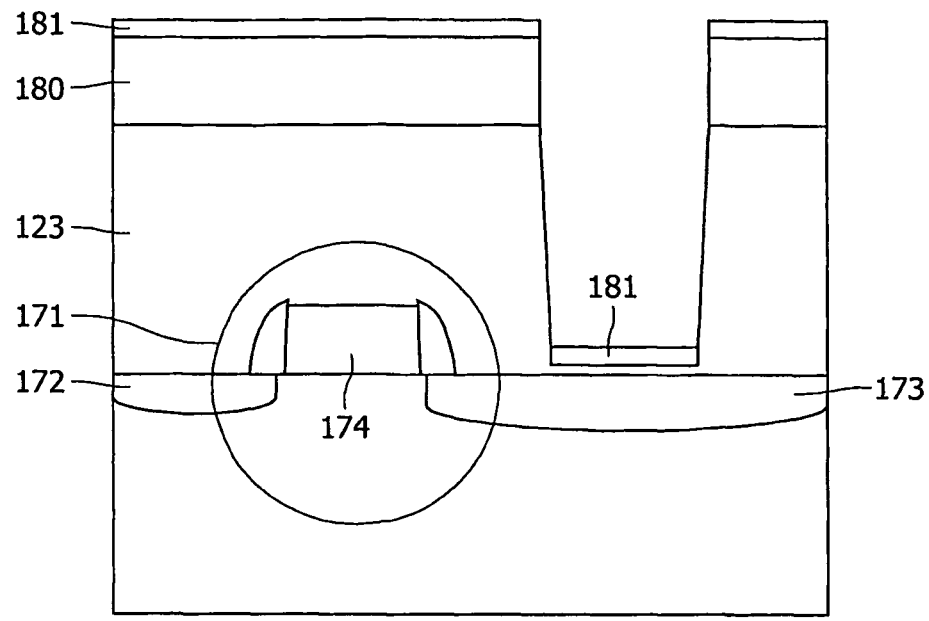
Figure 2B:
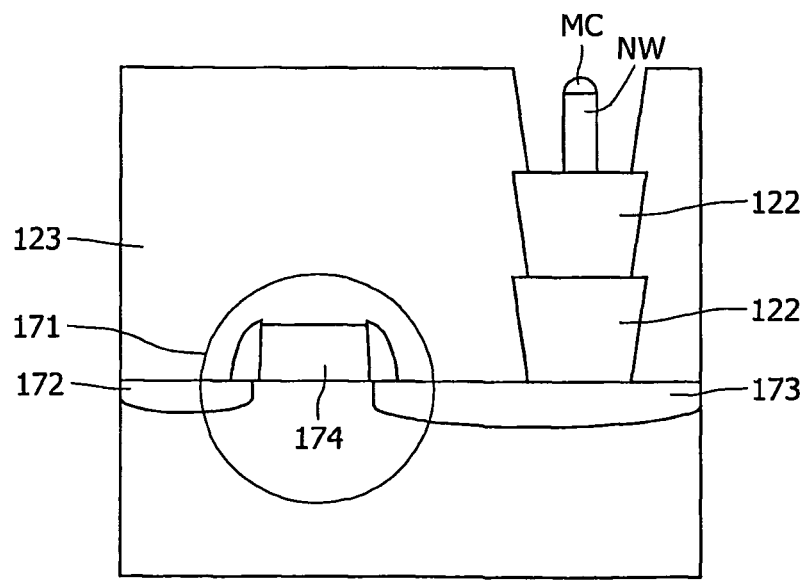

Instead of using a very long nanowire from the source (or drain) to metal 3, a more robust embodiment is shown in FIG. 2B. Standard back-end processing of contacts or vias can be used (either by Cu (dual) damascene or W plugs) before manufacturing the nanowire. In FIG. 2B an example is shown where the nanowires are grown on two vias, the nanowire extending from metal layer 2 to 3.

In this embodiment the source is connected to metal 1 and the gate of the selection transistor to metal 2. The connections to metal 1 and 2 are not drawn, because they are normally outside the plane of this cross-section.

Except for the electric connections described above the selection devices 171 and the selection lines 120, 121 are mutually insulated from each other by and embedded in a dielectric material 123, e.g. silicon dioxide. The dielectric material 123 may be composed of several layers which may include different materials. The surface of the dielectric material 123 may be polished by chemical mechanical polishing (CMP) for obtaining a relatively smooth and relatively plain surface. Subsequently, openings 124 shown in FIGS. 1 and 2 are created in the dielectric material 123 to expose the terminal regions, i.e. the source regions 172.

The structure thus obtained is provided inside the opening 124 with nanowires NW. In an embodiment the nanowires NW are grown by the vapor-liquid-solid (VLS) method which is described in the article "Growth and optical properties of nanometer-scale GaAs and InAs whiskers" by K. Hiruma et al., Journal of Applied Physics, volume 77, issue 2, page 447-457, 1995 and in the article "A Laser Ablation Method for the Synthesis of Crystalline Semiconductor Nanowires" by A. Morales and C. Lieber, Science, volume 279, page 208-211, 1998.

To this end, the structure thus obtained, in particular the opening 124, may be provided with a barrier layer 24 of e.g. Ti/TiN having a thickness of approximately 10-50 nm and on top thereof a metal film of e.g. Ni, Co, Fe or Au having typically a thickness of 0.2-5 nm. During an initial heating step metal clusters MC are formed from the metal film inside the opening 124 on top of the source region 172 as shown in FIG. 2. The metal clusters MC may have a size of 2-100 nm. The actual size may depend on the thickness of the metal film, the temperature at which the metal clusters are formed, the metal used and on the material of the barrier layer. Alternatively, the metal clusters MC may be deposited directly as colloidal metal particles of any of these materials, e.g. from a solution, on top of the barrier layer 24. Depositing the metal clusters MC from solution has the advantage that their size may be controlled relatively easily and reliably. In FIG. 2 the metal clusters MC should only remain in the contact hole. Therefore, the metal clusters outside the openings 124 are removed by polishing or angle dependent ion milling prior to the growth of the nanowires. Another technique to remove the MC is the use of resist lift off. This method is schematically shown in FIG. 2A. The opening 124 is etched with the use of a patterned resist layer 180. Before the resist is removed, the metal layer 181 is sputtered in the opening 124 and on the resist 180. Next step is to remove the resist 180 together with the metal layer 181. Only inside the opening 124 the metal layer remains, which can be transformed into metal clusters MC by a thermal treatment. The resist 180 is removed before the thermal treatment.

In the embodiment of FIG. 2A the barrier layer 24 is omitted. If a barrier layer is used, e.g. to protect the front-end from metal contamination, it may be partially removed, e.g. during the removal of MC to prevent shorts between the layer of memory material and the drain region.

Figure 3:
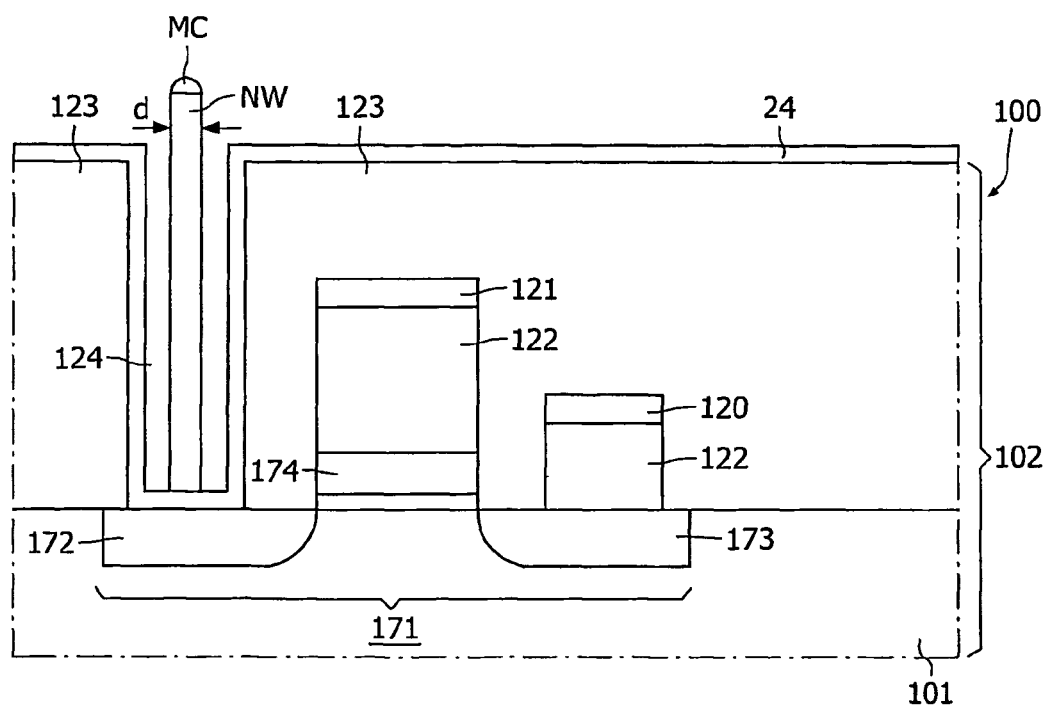

The metal clusters MC are used as nucleus or catalyst for growth of the nanowires in the VLS method. The metal clusters MC are heated to a temperature range of 400-800° C. and exposed to a precursor flow which comprises the desired semiconductor and which may include dopants. The metal clusters MC act as the energetically favored sites for absorption of the gas-phase reactants, i.e. the reactants condensate at these sites from which then nanowires NW grow. The result of this step is shown in FIG. 3. The size of the metal cluster MC acting in this way as a catalyst determines the diameter of the nanowire NW growing thereof.

The nanowires NW may be composed of InP, Ga, GaAs or Si, almost any group III-V semiconducting materials such as GaP and, InN InAs, group II-VI semiconducting materials such as CdS, CdSe, ZnS and ZnO. InAs nanowires have the advantage that they form a relatively low ohmic contact with almost all metals and that they have a relatively high electron mobility which may be above 1500 $cm^2/Vs$ such as 2300 $cm^2/Vs$ at an electron concentration of $10^{18}$ $cm^3$.

The nanowires NW may be n doped or p doped by one or more type of atoms depending on the semiconductor. Examples are Se for n doping and Zn for p doping in the case of InP, and Si for n doping and Mg for p doping in the case of GaN. The dopants may have a concentrations of e.g. $10^{15}$-$10^{20}$ $cm^{-3}$. For Si nanowires dopants from group III like P and/or As and from group V like B may be used for n-type and p-type doping, respectively.

When grown in this way the nanowires NW may be a single crystal nanowire NW. Preferably, the nanowires are grown in a direction other than the (111) direction such as the (100), (010), (001) or (211) direction because this results in a relatively good crystal quality of the nanowire. When growing nanowires in the (111) direction so called twinning effects may occur.

The diameter d of the nanowire NW depends on the substrate temperature during VLS growth and on the size of the metal clusters MC. A hollow nanowire, also referred to as nanotubes, may be used which results in a relatively small contact area between the nanowire and the memory material. For InP nanowires at a temperature T<500 degree C. solid nanowires are grown, but at a temperature T>500 degree C. hollow InP nanowires are formed. The nanowire NW may comprise a part with a solid core and a part with a hollow core.

The metal film, the metal cluster MC and/or the colloidal metal particles outside the opening 124 may be removed by polishing or angle-dependent ion-milling prior to the growth of the nanowires NW. At this moment the barrier layer (24) may be removed at least partly such that the level of the barrier layer 24 is lower than top of dielectric layer 123. This prevents that nanowires are grown outside the opening 124. If the metal film and/or the colloidal metal particles outside the opening 124 are not removed prior to the growth of the nanowires NW, the nanowires NW grow also on top of the barrier layer outside the opening 124. The nanowires NW outside the opening 124 may be removed later in the process, e.g. during removal of excess deposited further dielectric 223 as explained below.

Preferably, one nanowire NW is grown in each opening 124, i.e. the nanowires NW of the set are located in different openings 124. However, more than one nanowire NW per opening 124 is possible as well. In this latter case the nanowires NW of the set may be located in one and the same opening 124 or in different openings 124. After the steps described so far, a substrate 101 having a set of prefabricated nanowires NW having different lengths is usually obtained due to process fluctuations of the VLS method.

Figure 4:
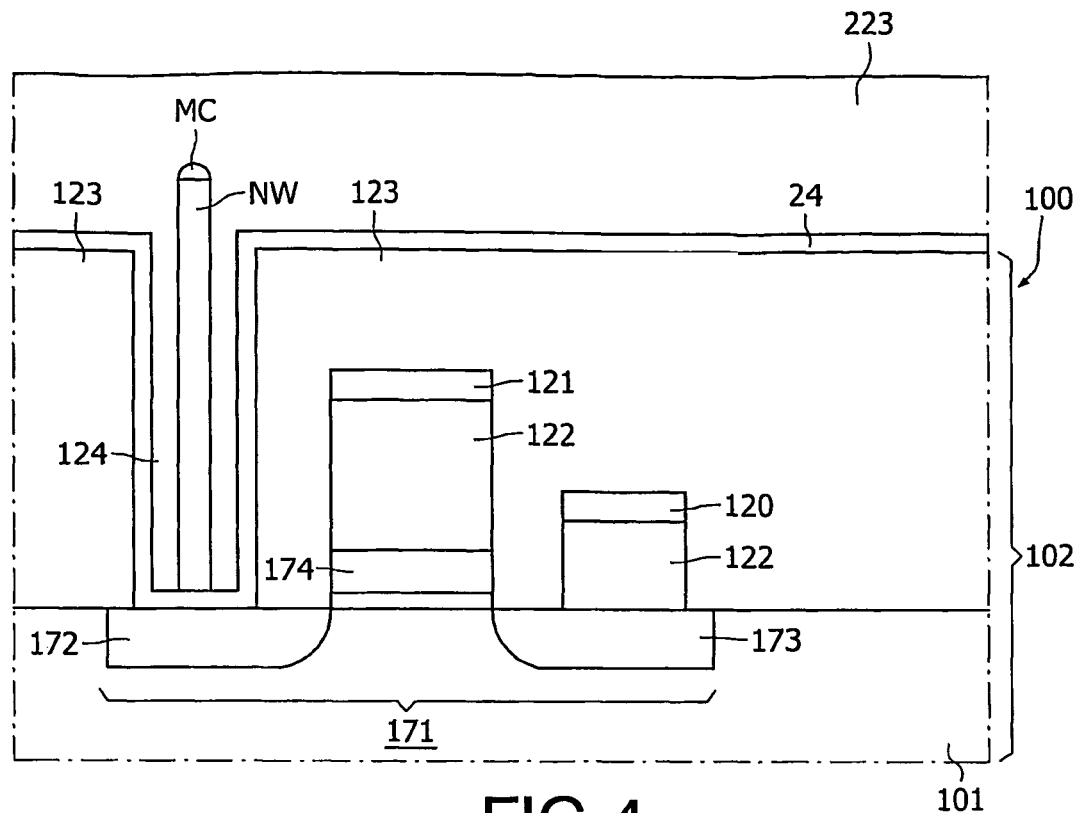

After growth of the nanowires NW the remainder of the opening 124 is filled with a further dielectric 223 which may be e.g. silicon oxide, e.g. derived from TEOS. The result of this step is shown in FIG. 4. Further dielectric 223 may be composed of a different material than dielectric 123, e.g. oxide and nitride, or vice versa, such that dielectric 123 can be used as a stop layer for polishing. Further dielectric 223 may be any electrically insulating material. A thermal insulator, such as porous $SiO_2$, may be advantageous in cases where changing the resistivity of the memory material requires increased temperatures. In some cases, e.g. when the electric device comprises standard CMOS devices as well, dielectric material 123 and further dielectric material 223 may be of the same material and the material removal may be polishing which is terminated after a fixed polishing time. Alternatively, the barrier layer 24, if present, may be used as stop layer.

Figure 5:
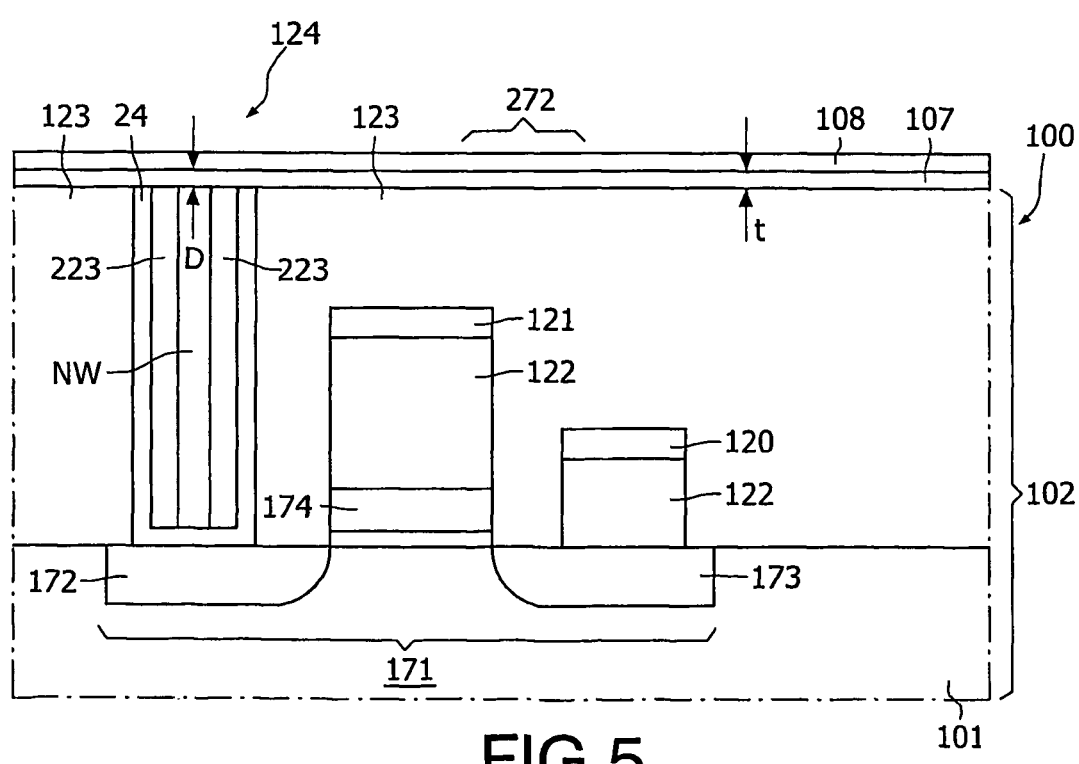

After deposition of the further dielectric 223, the set of prefabricated nanowires NW is subjected to a material removal treatment for obtaining the set of nanowires NW, each of which has the same height with respect to the substrate 101. During this material removal treatment, e.g. by etching or by CMP, the further dielectric 223 outside the opening 124 is removed as well to expose the upper end of the nanowires NW. As a result of this step each of the nanowires has the same contact area exposed as is shown in FIG. 5.

Subsequently, a layer 107 of memory material having an electrical resistivity switchable between a first value and a second value is provided to the structure thus obtained, and in particular to the exposed contact area, i.e. to the exposed an end portion of the nanowires NW. In the embodiment of FIGS. 1-5 the layer 107 is composed of a phase change material being changeable between a first phase and a second phase. The layer 107 has an electrical resistance which depends on the phase of the phase change material. The phase change material may be deposited by sputtering.

In one embodiment the phase change material is a composition of formula $Sb_{1-c}M_c$ with c satisfying $0.05 \le c \le 0.61$, and M being one or more elements selected from the group of Ge, In, Ag, Ga, Te, Zn and Sn. An electric device with a phase change material of this composition is described in the non-pre-published European Patent Application with application number 03100583.8 attorney's docket number PHNL030259, which is incorporated herein by reference in its entirety. Preferably, c satisfies $0.05 \le c \le 0.5$. Even more preferably, c satisfies $0.10 \le c \le 0.5$. A group of advantageous phase change materials has one or more elements M other than Ge and Ga at concentrations which are in total smaller than 25 atomic percent and/or comprise in total less than 30 atomic percent of Ge and/or Ga. Phase change materials comprising more than 20 atomic percent of Ge and Ga and one or more elements selected from In and Sn at concentrations which are in total between 5 and 20 atomic percent have a relatively high crystallization speed and at the same time a relatively high stability of the amorphous phase.

In an embodiment the phase change material is a composition of formula $Sb_aTe_bX_{100-(a+b)}$ with a, b and $100-(a+b)$ denoting atomic percentages satisfying $1 \le a/b \le 8$ and $4 \le 100-(a+b) \le 22$, and X being one or more elements selected from Ge, In, Ag, Ga and Zn. The phase change material may be, e.g., $Sb_{72}Te_{20}Ge_8$.

In yet another embodiment the phase change material is a composition of formula $(Te_aGe_bSb_{100-(a+b)})_cTM_{100-c}$ where the subscripts are in atomic percentages, a is below 70 percent, b is above 5 percent and below 50 percent, c is between 90 and 99.99 percent, and TM denotes one or more transition metal elements. Alternatively, the transition metal is omitted and the phase change material is a composition of formula $Te_aGe_bSb_{100-(a+b)}$ where the subscripts are in atomic percentages, a is below 70 percent and b is above 5 percent and below 50 percent such as, e.g., $Ge_2Sb_2Te_5$. Other examples of the phase change material are $Te_{81}Ge_{15}S_2As_2$ and $Te_{81}Ge_{15}S_2Sb_2$.

The layer 107 may have a thickness t of 1-400 nm such as e.g. 200 nm, 3-100 nm such as e.g. 30 nm, 10-20 nm such as e.g. 7 nm. In an embodiment layer 107 is a phase change material such as described above and the phase change material is in a state of relatively low resistivity, e.g. in crystalline or poly crystalline state. This state may be obtained by an anneal step after the deposition of the layer. The temperature of the anneal step depends on the material and on the required crystallization. For $Ge_2Sb_2Te_5$ an anneal above 175 degrees C. results in a cubic crystal, an anneal above 350 degrees Celsius results in a hexagonal crystal. For doped SbTe the anneal is typically carried out above 200 degrees S Celsius. The resistivity of the phase change material is locally altered to a state of relatively high resistivity during a write operation close to the contact of a nanowire NW with layer 107. In such an embodiment it is advantageous if each opening 124 is provided with only one nanowire NW because several parallel nanowires NW in one opening lead to a relatively small change in the resistance between the first terminal and the second terminal. It should be noted that in the known electric device the layer of phase change material is in the high resistivity, amorphous state which is changed locally at one nanowire to a low resistivity, crystalline state. This leads to a relatively large change of the resistance, i.e. from a relatively high resistance to a relatively low resistance. However, the total resistance is relatively high because the layer of phase change material is almost entirely in the amorphous state. In contrast to this, in this embodiment of the present invention the phase change material is in the low resistivity crystalline state.

On top of the layer 107 a contact electrode 108 may be deposited. The contact electrode 108 may be formed of a layer of e.g. TiN, W, TiW, TaSiN, TiSiN or TiAlC having a thickness of e.g. 50-200 nm. The contact electrode 108 may electrically connect the layer 107 of memory material to a second terminal 272 to which a sensing circuit may be connected. The second terminal 272 may be integral part of the contact electrode 108. The sensing circuit may be arranged to establish an electric parameter which relates to the resistance of a conductive path from the first terminal, formed in this embodiment by source region 172, via the nanowire NW, the layer 107 contacted thereby and the contact electrode 108 to the second terminal 272.

In the electric device 100 according to the embodiment shown in FIGS. 1-5 all nanowires NW are electrically connected to the layer 107 of memory material such that they have approximately the same distance D from their end point to the contact electrode 108 as is shown schematically in the inset of FIG. 5.

In the electric device 100 according to the invention a set of nanowires NW electrically connects the first terminal of the electric device 100 and the layer 107 of the memory material thereby enabling conduction of an electric current from the first terminal, formed in this embodiment by source region 172, via the nanowires NW and the layer 107 of the memory material to the second terminal 272 of the electric device. Each nanowire NW electrically contacts the layer 107 of the memory material in a respective contact area. For all nanowires NW of the set, the respective contact areas are substantially identical.

The first terminal may comprise at least two mutually insulated terminal regions, in the embodiment of FIGS. 1-5 nine source regions 172. Each of the mutually insulated terminal regions is electrically connected to the layer 107 of the memory material exclusively by a respective single nanowire NW.

In an alternative embodiment, not shown, at least one of the mutually insulated terminal regions of the first terminal is connected to the layer 107 of the memory material by more than one nanowire NW. Also in this embodiment it holds that for all nanowires NW of the set the respective contact areas are substantially identical.

In yet another embodiment, also not shown, there is only one terminal region of the first terminal which is provided with the set of nanowires NW electrically contacting the first terminal and the layer 107 of the memory material. The set may comprise more than one nanowire NW.

In the embodiment of FIGS. 1-5 each nanowire NW extends in a longitudinal direction and has a cross section perpendicular to the longitudinal direction. Each contact area is substantially identical to the cross section of the respective nanowire.

In the embodiment of FIGS. 1-5 the electric device 100 comprises an array of mutually insulated terminal regions formed by the source regions 172. Each of the terminal regions is electrically connected to the layer 107 of memory material by one or more respective nanowires NW and to a respective selection device 171 such that it is individually accessible via respective selection lines 120, 121 of the grid of selection lines.

In an alternative embodiment the pre-fabricated electric device 100 is subjected to a material removal treatment which has a different selectivity for the nanowires NW and the further dielectric 223. The difference in selectivity implies that either the nanowires NW are more effectively removed than the further dielectric 223 or that the further dielectric 223 is more effectively removed than the nanowires NW. The material removal treatment may comprise more than one material removal treatments such as a CMP step followed by an etching step.

Figure 6:
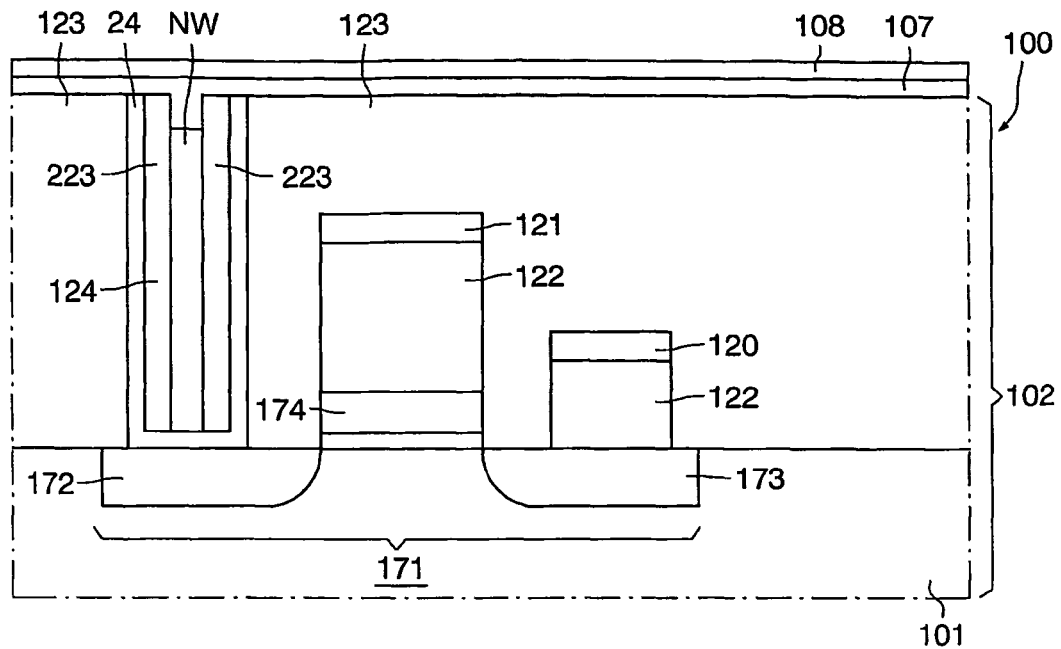

In the former case the nanowires NW is slightly recessed with respect to the further dielectric 223. The layer 107 of the memory material deposited onto this structure extends into the recesses thus formed thereby contacting the respective nanowire NW only inside the recess in an contact area which is identical to the cross section of the nanowire NW as is shown in FIG. 6. In this way the volume of the memory material in the vicinity of the contact area between the nanowire and the layer 107 is particularly small which is advantageous for memory materials such as phase change materials for which the energy required for changing the resistivity of the memory material scales with the volume of the memory material to be modified. Depending on the composition of the nanowires NW different etch agents may be used such as concentrated HCl, $Br_2$/HBr which etches InP much more effectively than $SiO_2$. For Si e.g. KOH may be used as it is selective towards $SiO_2$. Alternatively, a selective dry etch may be used.

Figure 7:
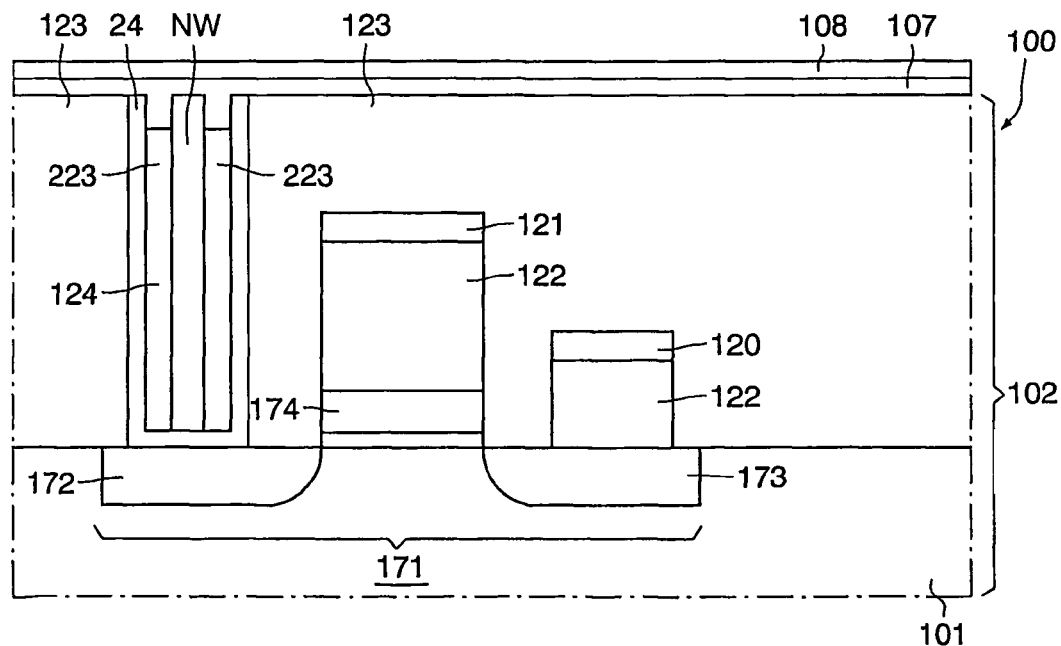

In the latter case the further dielectric 223 will be slightly recessed with respect to the nanowires NW and a part of the side wall of the nanowire is exposed. The layer 107 of the memory material deposited onto this structure extends into the recess thus formed thereby contacting the respective nanowire NW at the exposed end of the nanowire NW and those parts of the side wall being exposed as well as is shown in FIG. 7. In this way the contacting between the layer 107 of the memory material and the nanowire NW is particularly reliable. This may be achieved by etching with e.g. 0.01-10% HF which etches $SiO_2$ more effectively than InP and Si. Alternatively, a selective dry etch may be used.

In an embodiment, the source regions 172 of the MOSFET are connected to ground, i.e. the MOSFET have a common source. The drain regions 173 are provided with the nanowires NW instead of the tungsten plugs 122. The gate electrodes 174 are electrically connected to the respective select lines 121 analogous to the embodiment shown in FIGS. 1-5. The select lines 121 form word lines. The layer 107 of the memory material and the contact electrode 108 are patterned to form bit lines which may be used to both select a particular cell of the array and to detect the resistance of the memory material thus contacted.

Figure 8:
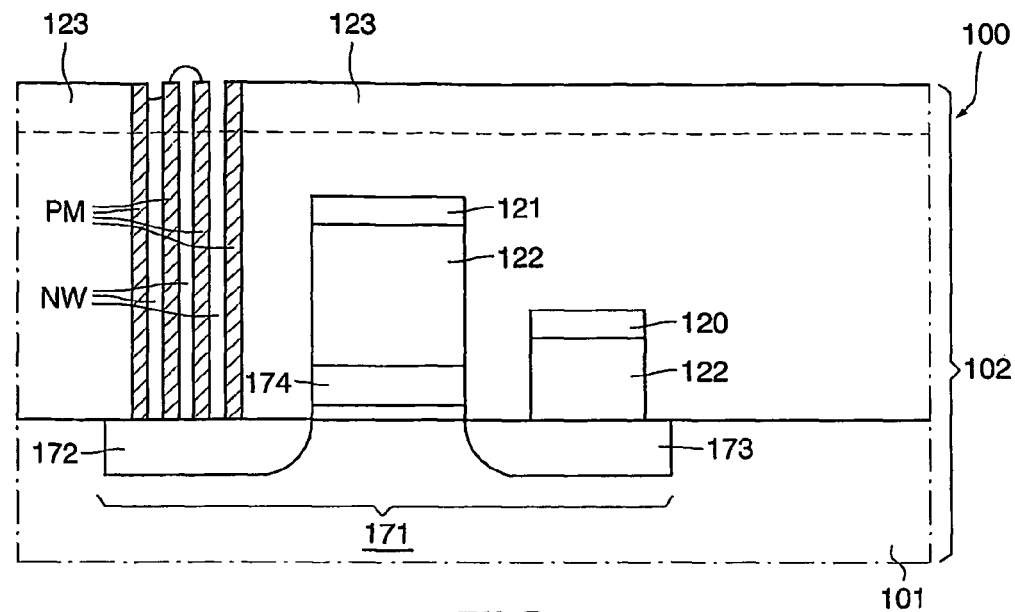
Figure 8A:
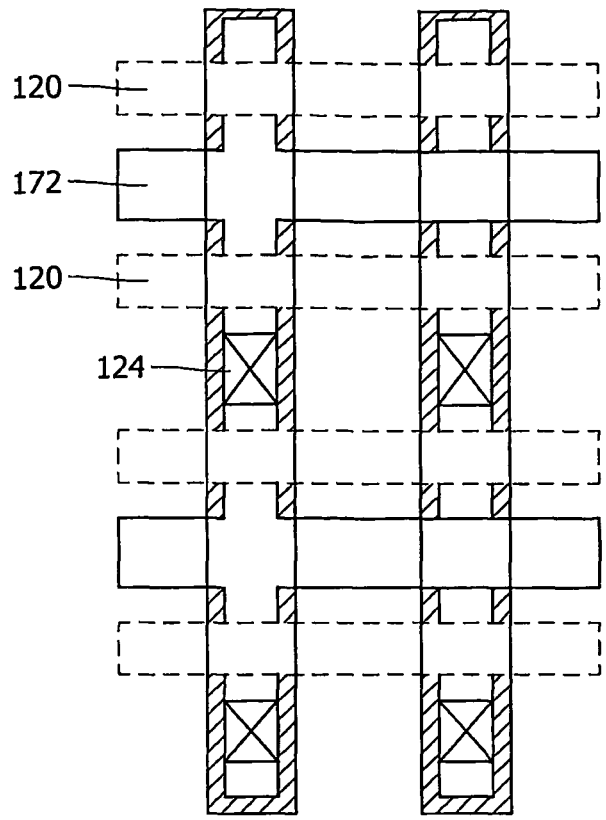
Figure 8B:
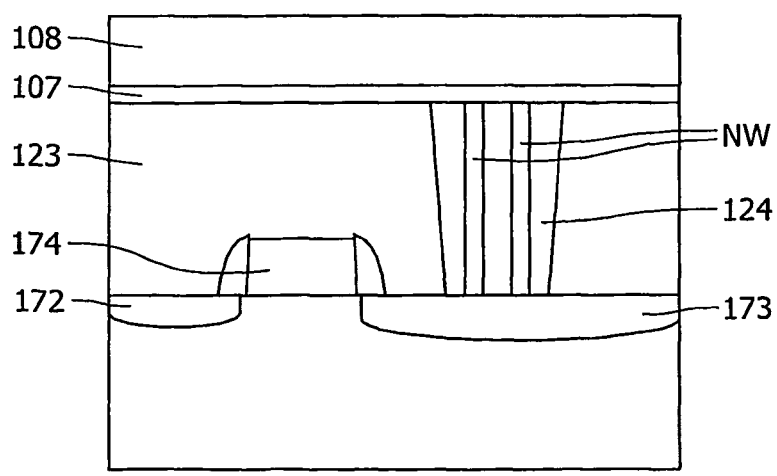

FIG. 8A shows a compact array design, with a low source line resistance. In FIG. 8B the corresponding memory cell is shown. In this case the nanowires are formed directly on the drain in the contact holes. The wordlines connecting the phase-change material are designed in metal 1.

In this example the metal line for the drain is designed in metal 3. The connection of the source line can be designed in metal 1 or 2. The advantage of connection in metal 2 is the easy strap construction to lower source line resistance. This is possible because the metal 2 lines run perpendicular to the metal 3 lines connecting the drain. The selection gate can be connected in metal 1 or 2.

Alternatively, the drain can be connected to metal 1. The source can be connected to metal 2 or higher.

Due to the symmetry of the array in FIG. 8A, there are 2 selection devices for every drain with nanowires. The extra selection line (indicated with *) can be left out and instead one can use isolation (STI) in between source line and drain contact. With currently available 90 nm design rules the cell size for one selection device is approximately 0.21 µm². With extra selection line it will be 0.26 µm², but with twice the current, because of the parallel selection devices.

In case of the array configuration of FIG. 1 the cell size is approximately 0.42μm² with 90 nm design rules. This relatively large cell size is due to separate active islands per cell and source line, which can not cross over drain contacts.

Figure 9:
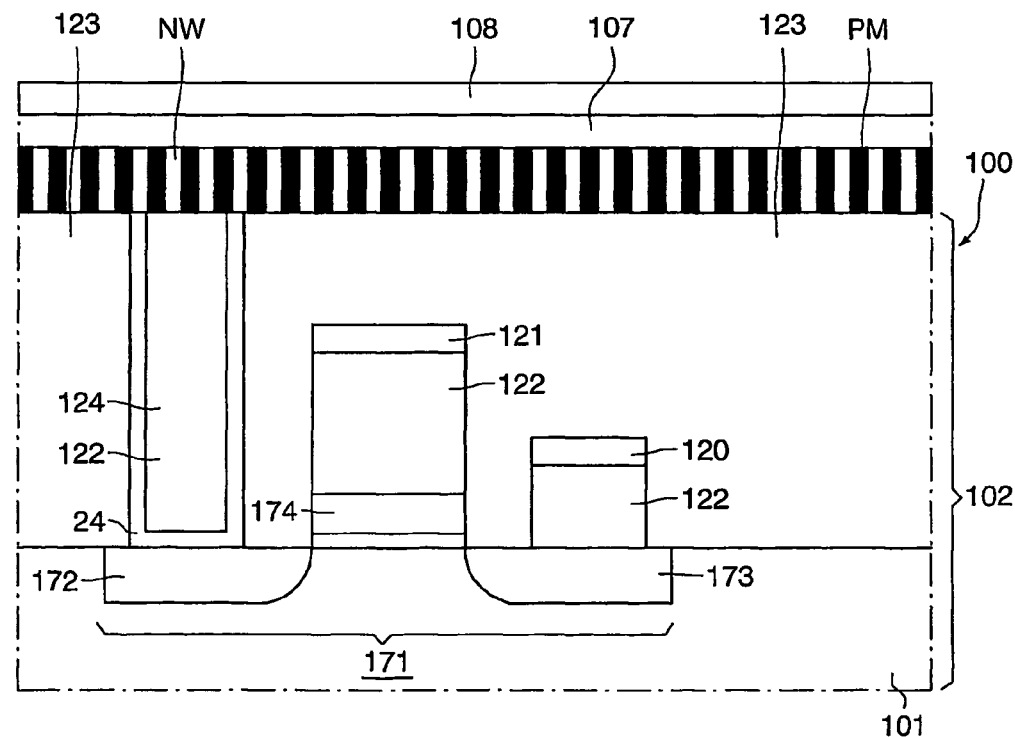

In another embodiment, shown in FIGS. 8 and 9 at different stages of the manufacturing process, the nanowires are metallic conductors. Such nanowires have a relatively good conductivity which is advantageous when a relatively large current is required for changing the resistivity of the memory material. An electric device 100 comprising such nanowires may be obtained by depositing a porous material PM such as e.g. anodized aluminum oxide, having a thickness of 100 nm up to several microns. The pore sizes can be tuned from 10 to 200 nm. The pore separation may be about twice the pore diameter. The density depends on the pore size and may be as high as $10^{10}$ cm$^{-2}$ and subsequently filling the pores electrochemically with a metal. Alternatively, the nanowires NW may be obtained by VLS processing by depositing the metal clusters at the bottom of the pores as is described in the article "Template-directed vapor-liquid-solid growth of silicon nanowires" in Journal of Vacuum Science and Technology B, volume 20, page 389-392, 2002 for the growth of Si-wires in the pores of aluminum.

The initial processing may be the same as described above with reference to FIGS. 1 and 2 except for the fact that the metal clusters MC are not formed inside the openings 124. Instead, the openings 124 are filled with a layer of porous material PM such as porous $Al_2O_3$, made by electrochemical oxidation of Al. The porous material PM outside the opening 124 is subsequently removed by a material removal treatment such as etching or polishing. Then metallic nanowires of e.g. Au, Cu, Ni, Se, Cd or any other suited metal are grown electrochemically into the pores. Alternatively, the metallic nanowires may be grown first and subsequently, the porous material PM outside the opening 124 may be removed. Details about the deposition of the layer of porous layer and the filling by metals or semiconductors may be found in the article "Membrane-based synthesis of nano-materials", by C. R. Martin et al. in Chem. Mater., volume 8, pages 1739-1746, 1996. The result of this step is shown in FIG. 8. It is shown that, analogous to the known electric device, the pre-fabricated electric device 100 may have nanowires NW with a mushroom structure. Alternatively or in addition, the nanowires NW may have different heights, i.e. may fill different parts of the pore as is illustrated schematically by the left and right nanowire NW in FIG. 8.

After growing the metallic nanowires in the pores, the pre-fabricated electric device 100 thus obtained is subjected to a material removal treatment such as e.g. CMP or etching to remove any metal outside the pores. In this way any mushroom like structures as in the known electric device are removed. As a result all nanowires exposed have substantially the same contact area exposed. The material removal treatment may remove the mushroom like structures only and end on the surface of dielectric material 123 shown in FIG. 8. Alternatively, it may continue to remove material until all nanowires NW have substantially the same length. This is schematically indicated by a dashed line in FIG. 8.

The pre-fabricated electric device 100 thus obtained is then provided with the layer 107 of the memory material and with the contact electrode 108. These latter two layers may be patterned to form bit lines. An advantage of the embodiment shown in FIG. 8 is that metal nanowires NW are able to conduct a relatively high current and therefore are able to provide a relatively large heating power compared with semiconducting nanowires.

Other porous materials may be suitable for making metal nanowires, like the porous materials nowadays investigated for CMOS backend processes such as mesa-porous silicon which has been described in WO 2003/024869. Alternatively track-etched polycarbonate polymer membranes as described by C. Schoenberger et al. in Journal of Physical Chemistry B, volume 101, page 5497, 1997, and W. D. Williams and N. Giordano, Review of Scientific Instrumentation, volume 55, page 410, 1984, may be used for obtaining metallic nanowires by electroplating. In this latter material the pores are formed by the creation of tracks in polymer films by irradiation with high-energy particles and etching of the tracks, resulting in almost parallel pores perpendicular to the membrane surface and uniform in diameter.

In a variation of this embodiment the openings 124 are not filled by porous material but by tungsten plugs 122, optionally provided with a barrier layer 24, followed by a material removal treatment such as a CMP step. On top of the surface thus obtained the porous material may be deposited the pores of which are then filled with metal nanowires. After growing the metallic nanowires in the pores, the pre-fabricated electric device 100 thus obtained is subjected to a material removal treatment such as e.g. CMP or etching to remove any metal outside the pores. In this way any mushroom like structures as in the known electric device are removed. As a result all nanowires exposed have substantially the same contact area exposed. The material removal treatment may continue to remove material until all nanowires NW have substantially the same length. On top of the layer thus obtained the layer of memory material and the contact electrode may be deposited and subsequently patterned into bitlines.

The selection device 171 may be build in the nanowires NW, e.g. by means of a pn junction between a semiconducting part of the nanowire which is p doped and a semiconducting part of the nanowire which is n doped. Such a pn junction, shown in the inset of FIG. 12, may be used for selecting one memory element and makes the selection transistors redundant. The array structure is comparable with a diode-ROM array. During a read operation the diodes of unselected cells may be biased in the non-conducting regime to avoid additional currents flowing towards the sense amplifiers. Without selection transistors the size of memory elements may be much smaller. Moreover, several layers of memory cells may be stacked on top of each other thus forming a 3D memory.

Figure 10:
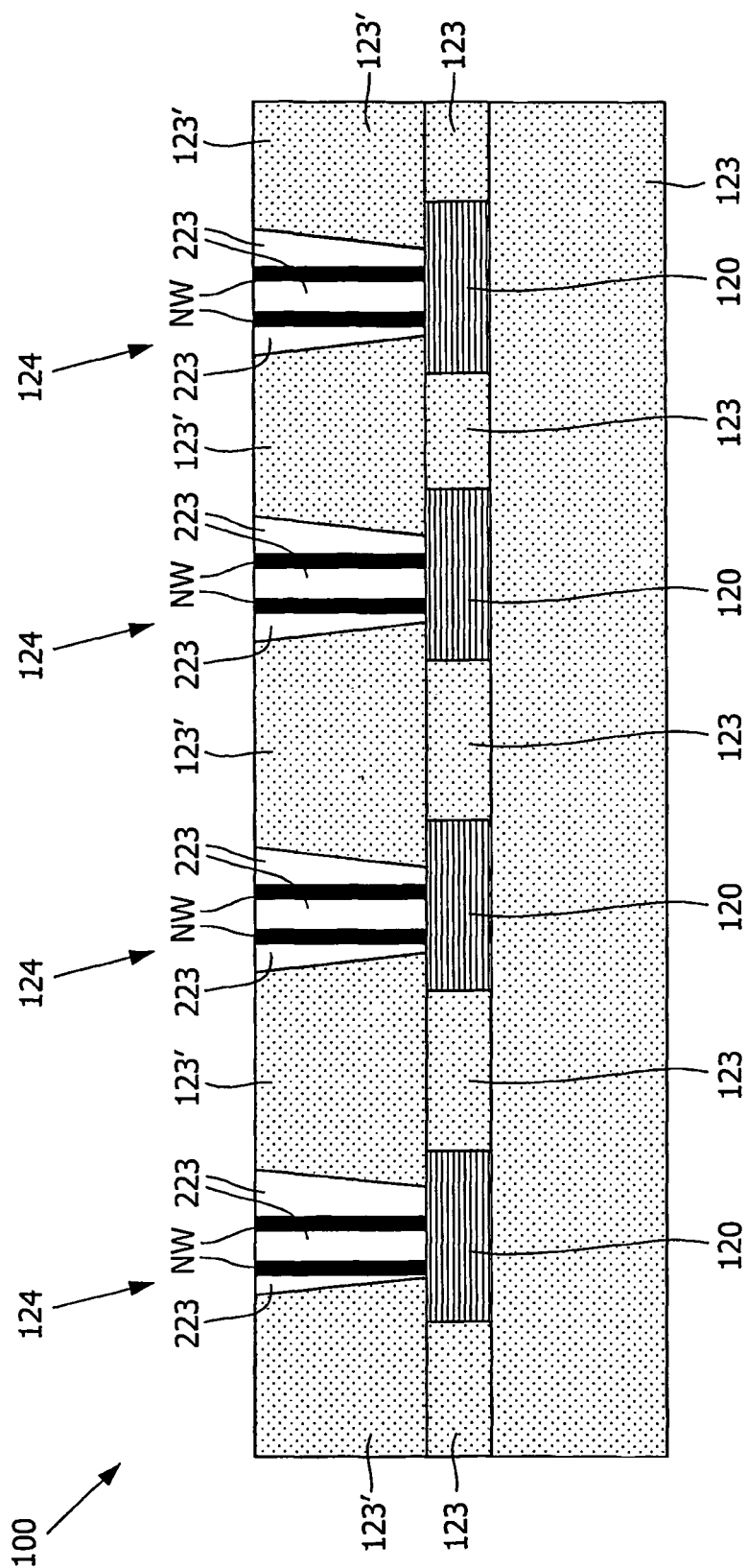

The nanowire comprising the selection device may be grown directly on the substrate 101, i.e. in the so called front end. Alternatively, it may be provided in the so called backend of an electric device 100 as is shown in FIGS. 10-13. In this latter case the nanowires may be embedded in one or more dielectric layers 123 such that they are in electric contact with a conductive layer such as an Al or Cu metal line. This layer may be a selection line 120 or 121 which may be obtained by standard IC processing. On top of the selection lines 120 a dielectric layer 123' of e.g. silicon oxide may be deposited. Dielectric layer 123' may be provided with openings 124 with which at least parts of the selection lines 120 are exposed. Inside openings 124 nanowires NW are grown by a VLS method in a way similar to that described with reference to FIGS. 2-5. First a metal cluster MC is deposited inside the opening 124, then the nanowires NW are grown in the opening 124, subsequently the remainder of the opening 124 is filled by a dielectric 223 and any dielectric 223 and/or nanowires NW outside the opening 124 are removed by a material removal treatment. The result of these steps is shown in FIG. 10. The openings 124 may be each provided with two, or even with more nanowires. Alternatively, at least one, or even all of the openings 124 may be provided with only one nanowire NW per opening 124.

In the VLS method used in this embodiment segmented nanowires comprising a pn junction may be obtained by changing the gas composition during nanowire growth. The gas is obtained by laser ablation of a doped target, i.e. the dopant has been added to the target before it is ablated. For obtaining n-type InP wires with a doping concentration of approximately $10^{18}$ cm$^{-3}$ 0.001-0.1 mol % Se is used, for obtaining p-type InP 0.1-1.0 mol % Zn is used. In a CVD type process organometallic doping agents, e.g. methyl-metal compounds, or chlorides of the doping atoms, e.g. MnCl$_2$, MgCl$_2$ for GaN, may be used. For doping by Si, SiH$_4$ may be added to the gas. Carbon (p-type) and silicon (n-type) may be used as dopants for GaAs and may be added in low concentrations to the gas flow.

The use of pn junction is for selection purposes to prevent parallel current from neighboring devices when arranged in an array. In this case the selection transistor can be omitted and cell size is reduced. The resistance of the diode is not of major importance as long as enough current is conducted through the diode. For high performance Si-based diodes such as Zener or punch-through types it is possible to obtain in the order of 10 µ-1 mA at a few volts forward biasing. The doping concentrations for the diode are in general between $10^{15}$-$10^{20}$cm$^{-3}$.

Figure 11:
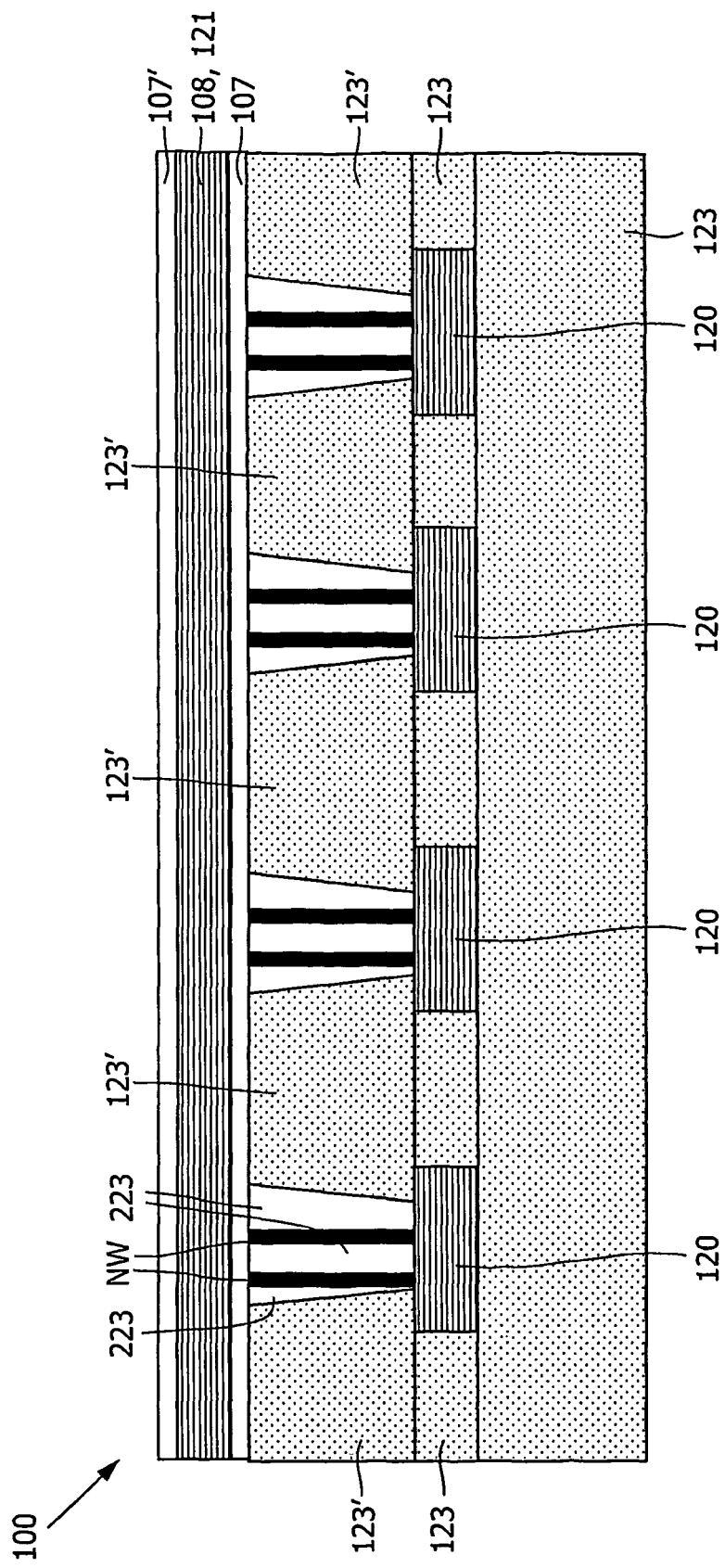

On top of the pre-fabricated device 100 shown in FIG. 10 a layer 107 of memory material is deposited. This may be any material described above with reference to FIG. 5. On top of the layer 107 a layer 108 of a metallic conductor such as TiN, W, TiW, TaSiN, TiSiN, TiAlC having a thickness of 50-200 nm may be provided, on top of which a layer of Al or Cu may be provided. In an embodiment layer 108 is provided with an additional layer 107' of memory material, in another embodiment this layer is omitted. The stack of layer 107, layer 108, if present, and layer 107', if present, may be patterned to form selection lines 121. Selection lines 121 may be perpendicular to selection lines 120. In FIG. 11 one selection line 120 is shown but the electric device 100 may comprise a multiplicity of, e.g. mutually parallel, of such selection lines 120 on top of the selection lines 121. This results in a quasi two-dimensional array of memory cells each comprising a layer of memory material 107 electrically contacted by a nanowire NW which has a selection device 171. The electric device 100 may be finished with a subsequent passivation layer and optionally with one or more interconnect layers.

Figure 12:
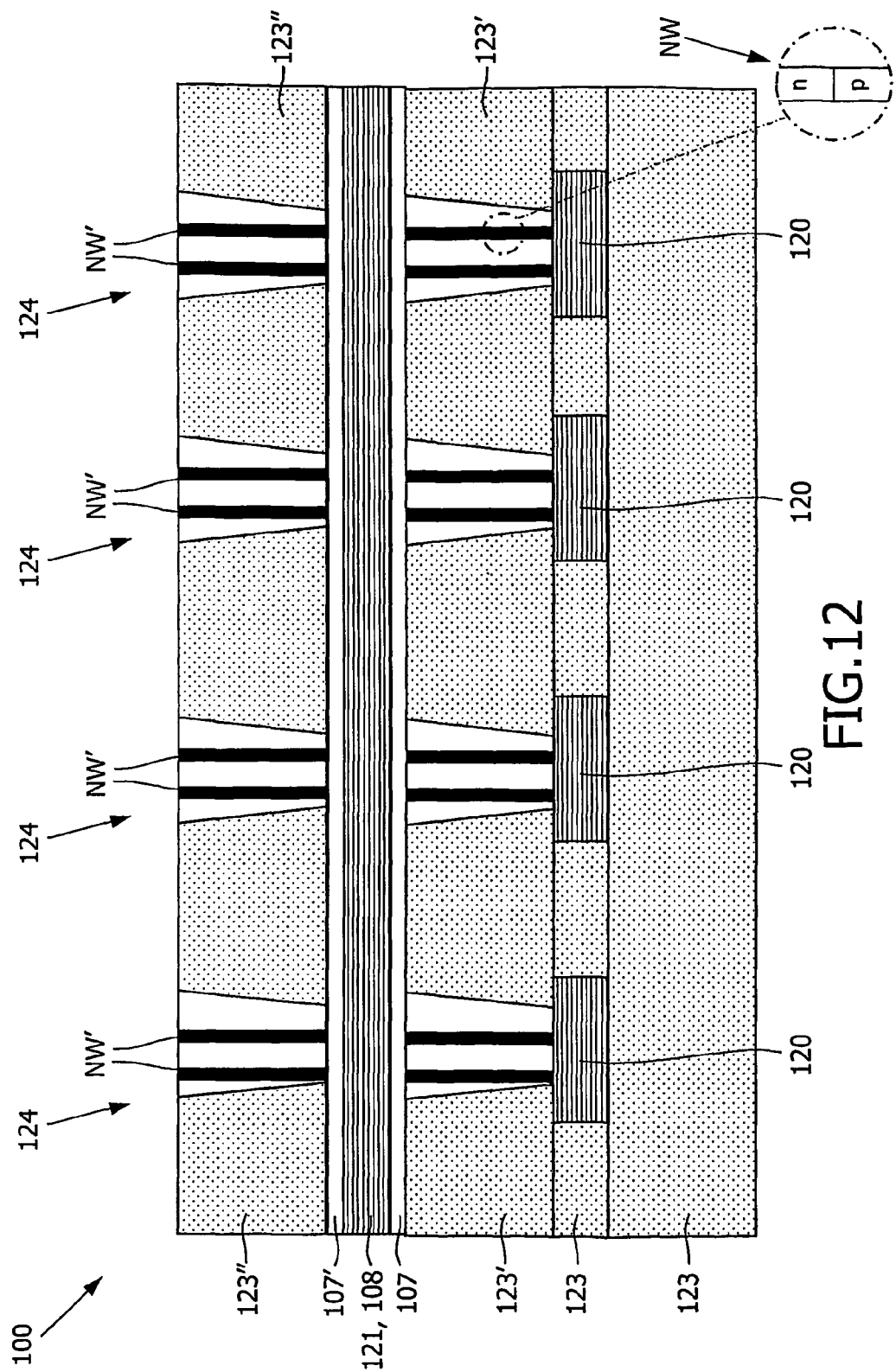
Figure 13:
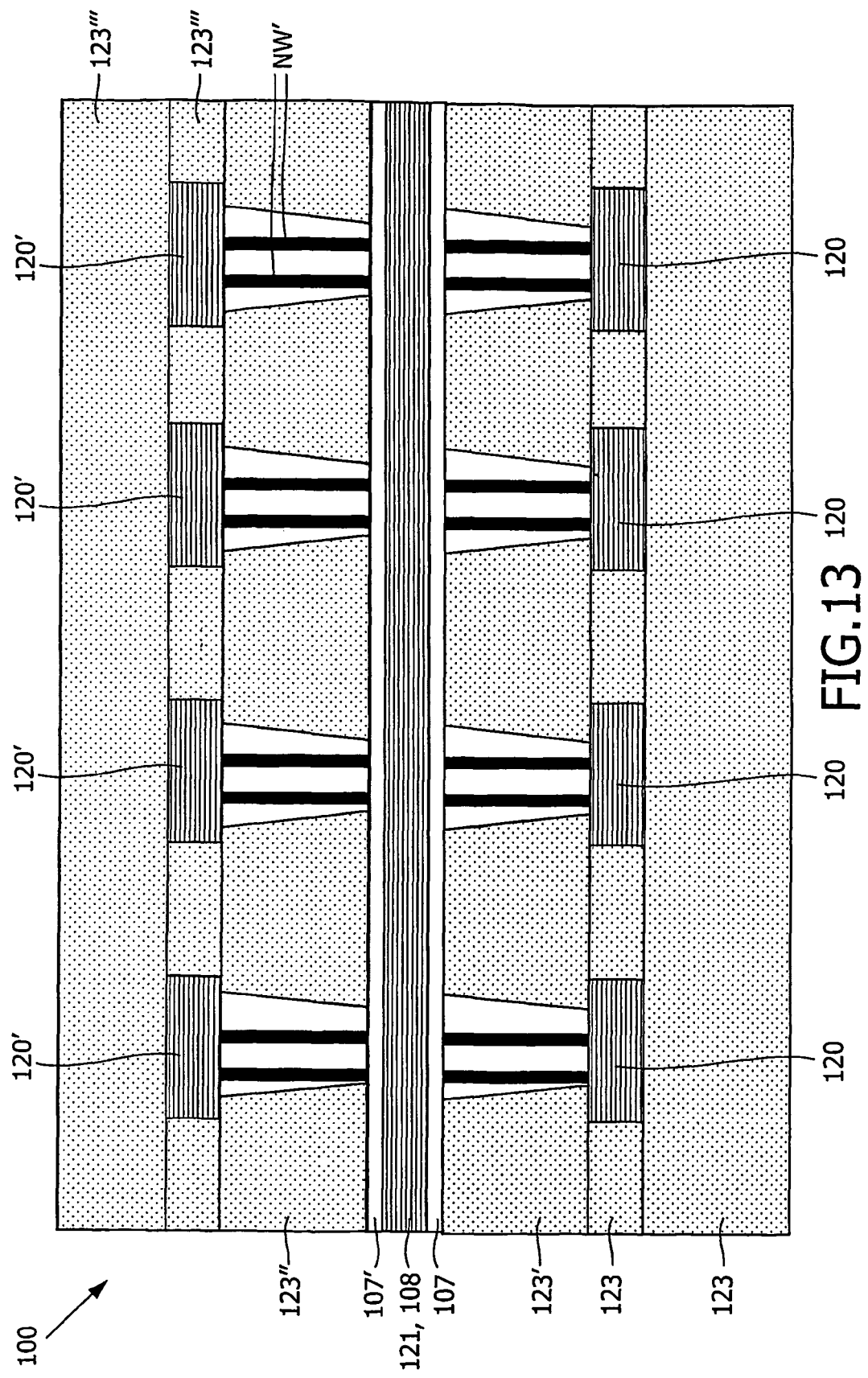

Alternatively, the electric device 100 may comprise of the structures shown in FIG. 11 stacked on top of each other. In such a case a three dimensional memory array may be obtained. To this end, the selection line 121 may be provided with an upper layer 107' of memory material as shown in FIG. 12, on top of which a dielectric layer 123" similar to dielectric layer 123' is provided. Dielectric layer 123" is provided with openings 124' exposing a part of the underlying layer 107'. The openings 124' are provided with nanowires NW' analogous to nanowires NW in openings 124. The remainder of the openings 124' may be filled with a further dielectric material 223' analogous to dielectric material 223. The dielectric material 223' and the part of the nanowires NW' outside the openings 124' may be removed by a material removal treatment, resulting in the pre-fabricated electric device 100 shown in FIG. 12. This pre-fabricated electric device 100 may be provided with selection lines 120' analogous to selection lines 120. Selection lines 120' may be provided with dielectric material 123'''.

Selection lines 120', nanowires NW', layer 107' of the memory material and selection lines 121 form a second level of the three dimensional memory array. In the embodiment shown in FIGS. 10-13 there are two levels each having four selection lines 120. However, the invention is not limited to this number of selection lines 120, 120' or to this number of levels.

The maximum allowable current density in the nanowire may be increased by increasing the thickness on the low doped side of the pn junction. The highly doped side of the nanowire may be thinner and in contact with layer 107 of the memory material. The different wire diameters of the two parts constituting the pn junction may be obtained by changing the substrate temperature during the growth of the nanowires as is described in the patent application WO 2003/083949 which is incorporated herein by reference.

Figure 14:
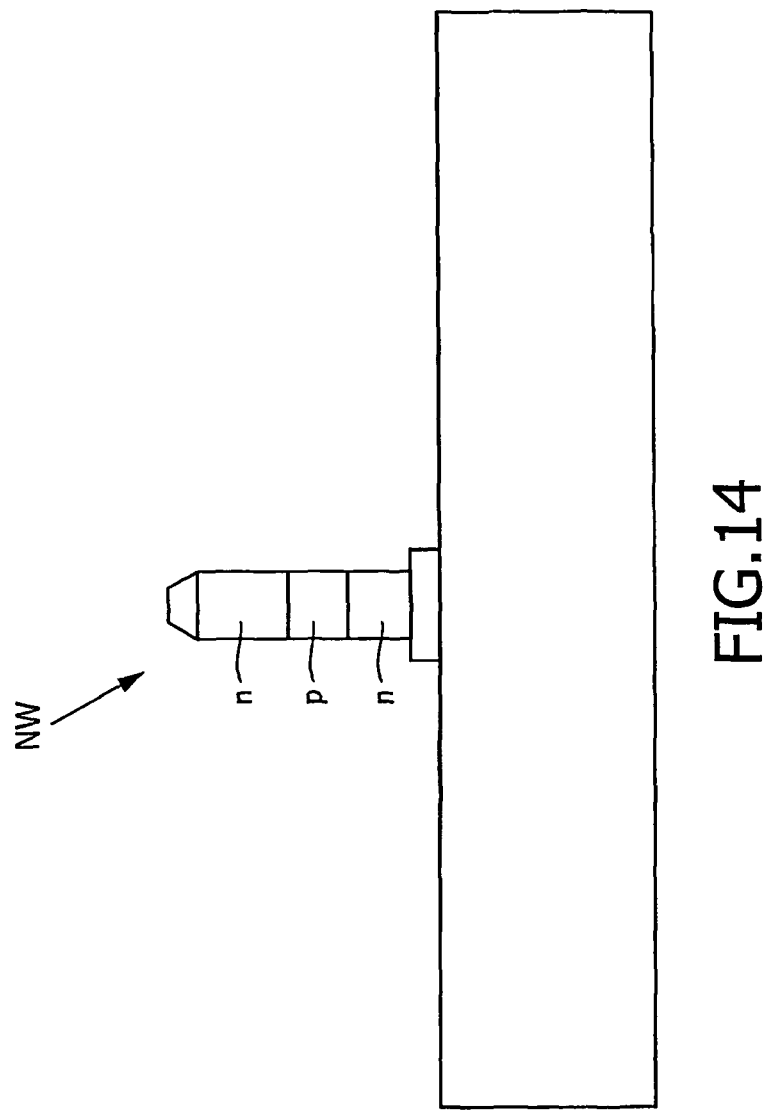
FIG. 14 shows a cross-section of an embodiment in which the selection device is a punch through diode.

In a variation of this embodiment doped nanowires NW are grown inside the openings 124, and 124' if present, which have incorporated an n-p-n junction as shown in FIG. 14. Such a nanowire NW may constitute a punch-through diode. Semiconducting monocrystalline nanowires of all IV, III-V, and II-VI classes can be synthesized by the VLS (vapor-liquid-solid) mechanism as described in the article "General synthesis of compound semiconductor nanowires" by X. Duan and C. M. Lieber in Advanced Materials, volume 12, pages 298-302, 2000. The wires may have lengths up to several microns and their diameter may be tuned in the range from 4 nm to a few hundred nm. The nanowires may be grown in the gas phase as well as on a solid substrate. By changing the chemical composition of the donor gas, p-n junctions can be grown inside the wires as is described in the article "Growth of nanowire superstuctures for nanoscale photonics and electronics" by M. S. Gudiksen et al., Nature, volume 415, page 617-620, 2002. Similarly, by changing the main components in the composition of the gas phase, e.g. from In and P to In and As, nanowires containing heterojunctions may be fabricated as is described in the article "One-dimensional heterostructures in semiconductor nanowhiskers" by M. T. Björk et al., Applied Physics Letters, volume 80, page 1058-1062, 2002.

The nanowire may be composed of three subsequent differently doped semiconductor regions such as n-p-n or p-n-p. Each of this region may be a doped semiconductor of the same or of a different class of materials. E.g. all three regions may be composed of one and the same III-V, II-VI or IV class material. An example of the former is InP. Alternatively, one of the regions may be of a different class of materials, e.g. a p doped II-VI class material sandwiched between two n-doped regions of a IV class material.

In this embodiment the doping profile of the nanowires may realize the punch-through diode functionality. A punch-through diode is a non-linear element comprising at least a first and a second region of a first conductivity type and a third region of a second conductivity type between the first and the second region. The first and the third region on the one hand, and the third and the second region on the other hand form two oppositely located rectifying junctions. At least one of these can be biased in a forward direction by means of the electric field of the other junction, which is reversely biased. The width of the third region is sufficiently small and its doping profile is such that punch-through occurs between the two junctions before one of the junctions breaks down in at least one bias direction. The punch-through diode has two terminals with the same doping type. Therefore, a relatively small number of different materials may be used in various steps of the production process when electrically connecting the terminals. A wide range of materials may be used. An incomplete list contains: elemental semiconductors and their alloys such as group IV materials, e.g. Si, Ge, $Si_xGe_{1-x}$, group III-V materials, e.g. GaAs, group II-VI materials, e.g. ZnS. When the semiconductor regions constituting the punch through diode are part of a nanowire, this has the advantage that mono-crystalline semiconductor regions, even of different semiconducting materials, may be grown on top of each other, e.g. by the VLS method. In this way a relatively low resistance of the semiconducting regions is obtained while requiring a relatively low temperature of 400 to 550 degrees Celsius. This manufacturing of a high quality, low resistance selection device at relatively low temperatures allows for integration of punch through diodes in process flows such as in the backend of an IC which allow only relatively low temperatures. The advantage of a relatively low resistance and a relatively low temperature does not dependent on whether or not the punch through diode is connected to a layer of memory material.

The doping profile may be a symmetric n-p-n profile or an asymmetric n-p$^+$-p-n profile. The thickness of the p-segment may be chosen such as to achieve the desired reach-through and flat-band voltages. An alternative may be a double heterojunction with the central segment having a higher majority-carrier band minimum, e.g. InAs-InP-InAs for an electron device.

The electric device according to this aspect of the invention may have one or more of the following advantages: the nanowires may have a relatively low resistivity, in particular when the nanowires are mono-crystalline. It has been shown by M. T. Björk et al. in the above cited paper that the VLS process is able to deliver mono-crystalline nanowires with a relatively low defect density, resulting in a relatively high carrier mobility. This enables the nanowires to support a relatively high current density. By appropriate metallurgy and processing contact resistances below 20 k$\Omega$ such as between 1 and 5 k$\Omega$ may be achieved as is shown in the article "Single-electron tunneling in InP nanowires" by S. De Franceschi et al. in Applied Physics Letters, volume 83, pages 344-346, 2003. In combination with the low nanowire resistivity this enables a large on/off ratio when the nanowire is used as a selection device. Both the VLS method and the fabrication of the contacts may be performed at temperatures not exceeding 500° C., and yet deliver mono-crystalline material. This enables CMOS compatibility.

After formation of a conductive layer, which may be a W interconnect, a small amount of catalyst metal such as Au, Fe, Co or Ni is deposited, e.g. by evaporation. This deposition may be selectively on the plugs. The catalyst metal is used as catalyst in standard VLS growth to grow nanowires from a semiconducting material such as InP, InAs, GaAs. At a particular memory element position, e.g. in a particular opening 124, a single nanowire or a small set of nanowires may be grown, dependent on the number of metal particles present.

The doping profile of the nanowires is chosen such as to realize the desired diode characteristics. This may be achieved by changing the composition of the gas vapor during the growth. The composition may be changed by illuminating, e.g. with a laser, different samples during different time periods during the growth whereby atoms of the illuminated sample are brought into the gas phase and condensating in the nanowire.

In the embodiment shown in FIG. 14, the punch-through diode is symmetrical, and comprises a first region of a semiconducting material of a first conductivity type, in this example p-type, between a second region of a semiconducting material of a second conductivity type, in this example n-type, and a third region of a semiconducting material of a second conductivity type, in this example n-type. In one example it is implemented as a silicon device having n$^+$ layer which is doped by As in a concentration of $10^{20}$ cm$^{-3}$, a p layer which is doped by B in a concentration of 5-$10^{18}$ cm$^3$ and a n$^+$ layer which is doped by As in a concentration of $10^{20}$ cm$^{-3}$. The thickness of the p-region, i.e. the distance between the two n-regions, is 30 nm. A half select scheme may be employed for reading, writing and erasing, i.e. the memory element to be programmed receives the full voltage $V_p$. Other memory elements can have a zero, positive half bias $V_p/2$ and negative half bias $-V_p/2$. Alternatively, the nanowire may be composed of InP, GaAs, InAs and/or GaN, and the n and p regions are made by doping with group IV elements such as Si, group VI elements such as S, Se, or Te, and C, Be, Zn, respectively. The p region may have a thickness of typically some tens of nm parallel to the longitudinal direction of the nanowire. The main requirement for the thickness is that it is sufficiently small and its doping profile is such that punch-through occurs between the two junctions before one of the junctions breaks down in at least one bias direction.

In a variation of the embodiment shown in FIG. 14, the p region is composed of a relatively highly doped p+ region and of a relatively lowly doped p region. The p+ region and the p region may have a thickness of some tens of nm parallel to the longitudinal direction of the nanowire, respectively. The exact values of the thickness and the doping concentrations are determined by the desired electrical characteristics.

In a variation of the embodiment shown in FIG. 14, an additional barrier layer and/or contact resistance layer of e.g. Ti/Al or other materials suitable to contact the nanowires, is deposited, e.g. by sputtering or evaporation. The additional barrier layer and/or contact resistance layer may be deposited on W plugs. An extra process step may be introduced to structure this layer such that it is present on the plugs only.

When the nanowires are grown inside openings 124, instead of metal also alternative connecting materials like TiN, TaN may be used. In this case the wires may be directly grown in already present vias.

The selection devices as shown in FIGS. 10-14 and described in all the previous embodiments may be provided with a gate. The selection devices may be vertical PN diodes or transistors. For the PN diode or punch through diode the extra gate can be used to reduce or even prevent surface leakage.

Figure 15:
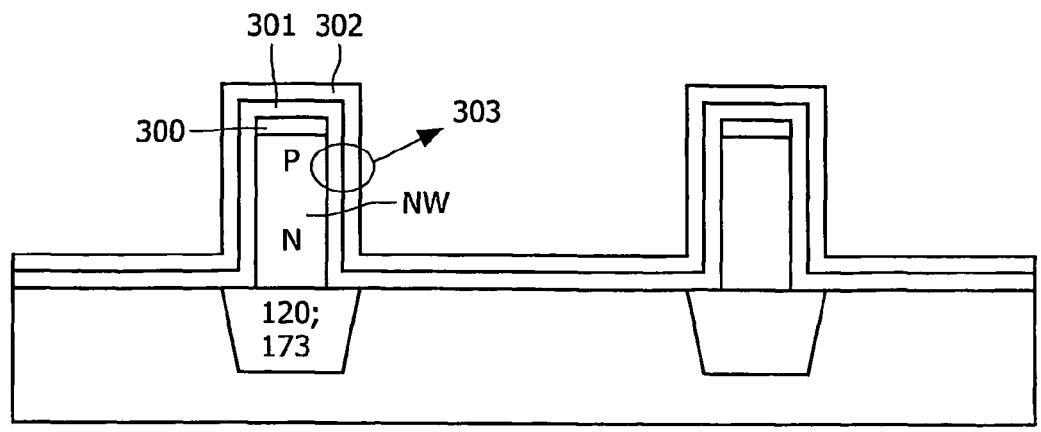
FIG. 15 shows a cross-section of an embodiment of the manufacturing of a selection device provided with a gate dielectric and a gate.

FIG. 15 shows the first stage in the manufacturing process of a selection device provided with a gate. In this embodiment the selection device is a nanowire comprising a PN diode. The nanowire diode can be a PN or NP or punchthrough diode like P$^+$NP$^+$ or N$^+$PN$^+$, Schottky diode, hetero structures or combinations thereof.

The diode can be either provided on an implanted area ('drain') in the bulk of the substrate or can be provided on a 'bitline' consisting of a via (or metal line). The diode is capped by an electrically insulating layer 300, such as nitride. Next, a gate dielectric 301 is grown or deposited (such as a silicon oxide or a high-K layer) together with a gate layer 302. The thin gate layer 302 may have a thickness of about 10 nm, preferably consisting of a metal like e.g. TiN, TaN or Al. The nanowire diode provided with the gate stack 303 is shown in FIG. 15.

Figure 16:
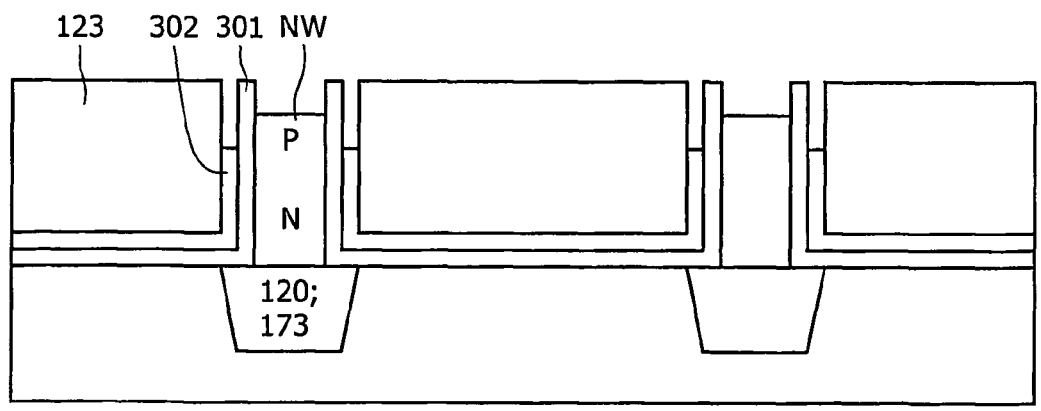
FIG. 16 shows a cross-section of the selection device and the gate stack of FIG. 15, in a further stage of the manufacturing process.

After gate stack 303 deposition, a dielectric layer 123 such as siliconoxide or a low K material is deposited and subsequently planarized by chemical mechanical polishing (CMP). On top of the capping layer 300 the metal gate layer 302 and the gate dielectric layer 301 is removed with the CMP process. The capping layer 300 is used as a stopping layer for the CMP process. After this CMP step a short metal etch is done, either wet or dry. Also the capping layer 300 is removed; The result is shown in FIG. 16. A thin dielectric layer (approximately having a thickness similar to the thickness of the gate layer), e.g. oxide, is deposited and etched into spacers 305, opening the diode structure. This spacer reduces the active area and this is advantageous for the operation of the memory device. The metal gate will not be exposed due to the anisotropic nature of the spacer etch. Also isotropic etching can be used (no spacers will be formed) without exposing the metal gate by optimizing the metal etch and the thickness of the deposited layer.

Figure 17:
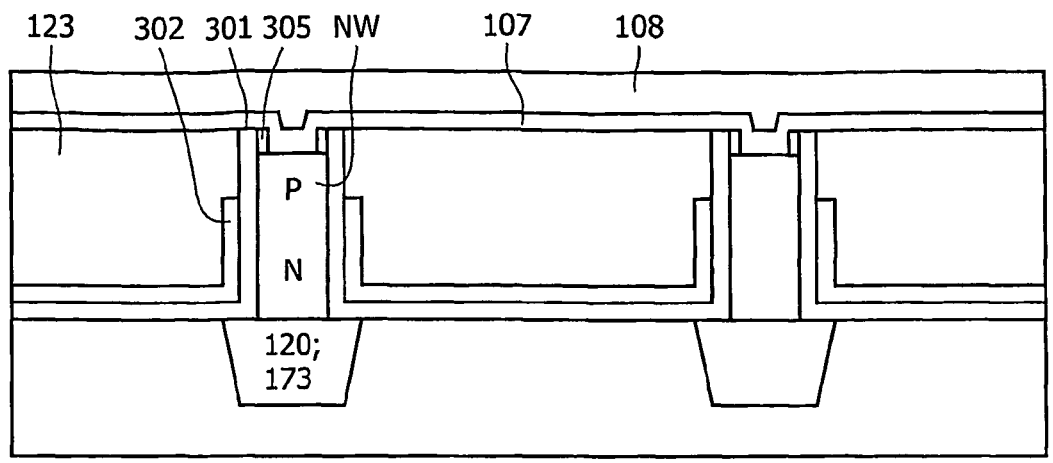
FIG. 17 shows a cross-section of the selection device provided with the gate dielectric and the gate, the selection device being connected to a memory element and a top electrode.

In a next step the diode NW is connected to a memory element 107 and a top electrode 108 (word line). The memory element 107 can be a phase change memory element or a different type of resistive element like a programmable metallisation cell (PMC), RRAM or molecular storage cell. The top electrode 108 plus memory element 107 are patterned in wordlines (see FIG. 17).

The gate 301 is used to reduce leakage currents of the NW diode.

Leakage can occur at the surface of the nanowire, due to interface states. In particular polysilicon nanowires suffer from this phenomena. By a negative or positive voltage on the gate a depletion region is formed on the N type part (negative voltage) or P type part(positive voltage) of the diode. In both cases this depletion will block the leakage current caused by the surface of the diode. Because the voltage is the same for all selection diodes the gate only has to be connected outside the array and does not introduce extra contacts in the array.

The selection devices are preferably processed in the back end of the manufacturing process (metallization traject). The advantages to incorporate the selection devices in the back-end are firstly that it can be added above a chip design and secondly more layers can be stacked on top of each other.

Figure 18:
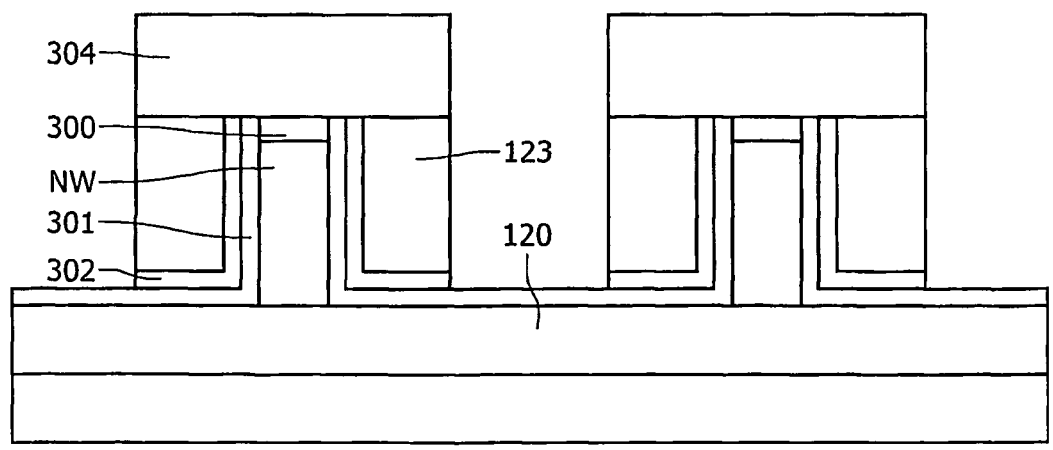
FIG. 18 shows a cross-section of an alternative embodiment in which the selection device with a gate stack is manufactured on top of a bit line.

In an alternative embodiment, instead of a PN diode a selection transistor can be manufactured. One starts with nanowires (e.g. silicon), preferably already with source and drain incorporated in the nanowire. The processing is the same up to and including CMP step as described in FIG. 15. After this step wordlines are patterned by means of resist patterning 304, etching of oxide 123 and etching of the gate 301 as shown in FIG. 18. Mask misalignment will not influence the electrical properties of the selection device, because the gate length is not defined by lithography.

After removal of the resist 304, a dielectric 123' such as oxide is deposited and planarized by CMP using the capping layer 300 as a stopping layer. The manufacturing steps after the CMP step are similar to the manufacturing steps a for the diode described above in FIGS. 16-17.

In summary, the electric device 100 according to the invention comprises a layer 107 of a electrically conductive material which may have an electrical resistivity switchable between a first value and a second value. The memory material may be a phase change material. The electric device 100 further comprises a set of nanowires NW electrically connected to the layer 107 of electrically conductive material thereby enabling conduction of an electric current via the nanowires NW to the layer 107 of electrically conductive material. Each nanowire NW electrically contacts the layer 107 of memory material in a respective contact surface. All contact surface have substantially identical surface areas. The method according to the invention is suited to manufacture the electric device 100 according to the invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. An electric device comprising:
   a layer of an electrically conductive material, and
   a set of nanowires (NW) electrically connected to the layer of the electrically conductive material for conducting an electric current via the nanowires (NW) to the layer of the electrically conductive material, each nanowire (NW) electrically contacting the layer of the electrically conductive material in a respective contact surface, all contact surfaces having substantially the same surface area;
   wherein at least one of the nanowires (NW) and the layer of electrically conductive material is electrically connected to a selection device, wherein the selection device is a diode and the selection device is provided with a gate.

2. An electric device as claimed in claim 1, wherein the diode is integral part of a nanowire (NW) of the set.

3. An electric device as claimed in claim 2, wherein the diode is a punch through diode.

\* \* \* \* \*